(12) United States Patent
Eilert et al.

(10) Patent No.: US 11,899,961 B2
(45) Date of Patent: Feb. 13, 2024

(54) REDUNDANT COMPUTING ACROSS PLANES

(71) Applicant: Micron Technology, Inc., Boise, ID (US)

(72) Inventors: Sean S. Eilert, Penryn, CA (US); Kenneth M. Curewitz, Cameron Park, CA (US); Helena Caminal, Ithaca, NY (US); Ameen D. Akel, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 17/652,229

(22) Filed: Feb. 23, 2022

(65) Prior Publication Data

US 2023/0214148 A1 Jul. 6, 2023

Related U.S. Application Data

(60) Provisional application No. 63/266,216, filed on Dec. 30, 2021.

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
None
See application file for complete search history.

(56) References Cited

U.S. PATENT DOCUMENTS

| 8,332,580 | B2* | 12/2012 | Akerib | G06F 15/7821 |
| | | | | 711/108 |
| 9,997,212 | B1* | 6/2018 | Finkbeiner | G11C 7/106 |
| 2017/0242902 | A1* | 8/2017 | Crawford, Jr. | G06F 16/258 |
| 2022/0066777 | A1* | 3/2022 | Finkbeiner | G06F 9/30101 |
| 2022/0244959 | A1* | 8/2022 | Ilan | G06F 9/3004 |

OTHER PUBLICATIONS

S. Jeloka, N. B. Akesh, D. Sylvester, and D. Blaauw, "A 28 nm configurable memory (TCAM/BCAM/SRAM) using push-rule 6t bit cell enabling logic-in-memory," IEEE Journal of Solid-State Circuits, 2016.

(Continued)

*Primary Examiner* — Elias Mamo
(74) *Attorney, Agent, or Firm* — Holland & Hart LLP

(57) ABSTRACT

Methods, systems, and devices for redundant computing across planes are described. A device may perform a computational operation on first data that is stored in a first plane that includes content-addressable memory cells. The first data may be representative of a set of contiguous bits of a vector. The device may perform, concurrent with performing the computational operation on the first data, the computational operation on second data that is stored in a second plane. The second data may be representative of the set of contiguous bits of the vector. The device may read from the first plane and write to the second plane, third data representative of a result of the computational operation on the first data.

32 Claims, 10 Drawing Sheets

(56) References Cited

OTHER PUBLICATIONS

A. Morad, L. Yavits, S. Kvatinsky, and R. Ginosar, "Resistive GP-SIMD processing-in-memory," ACM Trans. Archit. Code Optim., 2016.
K. Pagiamtzis and A. Sheikholeslami, "Content-addressable memory (CAM) circuits and architectures: a tutorial and survey," IEEE Journal of Solid-State Circuits, 2006.
G. E. Sayre, "Staran: An associative approach to multiprocessor architecture," in Computer Architecture.Springer Berlin Heidelberg, 1976.
A. E. Slade and H. O. McMahon, "A cryotron catalog memory system," in Eastern Joint Computer Conference: New Developments in Computers, 1957.
L. Yavits, A. Morad, and R. Ginosar, "Computer architecture with associative processor replacing last-level cache and simd accelerator," IEEE Transactions on Computers, 2015.
Y. Zha and J. Li, "Hyper-AP: Enhancing associative processing through a full-stack optimization," in 2020 ACM/IEEE 47th Annual International Symposium on Computer Architecture, 2020.
Helena Caminal, Kailin Yang, Srivatsa Srinivasa, Akshay Ramanathan, Khalid Al-Hawaj, Tianshu, Wu, Vijay Narayanan, Christopher Batten, Jos e Mart nez, \Cape: A Content-Addressable Processing Engine, The 27th IEEE International Symposium on High-Performance Computer Architecture (HPCA-27), Feb. 2021, Seoul, South Korea.
C. C. Foster, Content Addressable Parallel Processors. John Wiley & Sons, Inc., 1976 (233 pages).

* cited by examiner

REDUNDANT COMPUTING ACROSS PLANES

CROSS REFERENCE

The present Application for Patent claims the benefit of U.S. Provisional Patent Application No. 63/266,216 by EILERT et al., entitled "REDUNDANT COMPUTING ACROSS PLANES," filed Dec. 30, 2021, assigned to the assignee hereof, and expressly incorporated by reference herein.

FIELD OF TECHNOLOGY

The following relates generally to one or more systems for memory and more specifically to redundant computing across planes.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
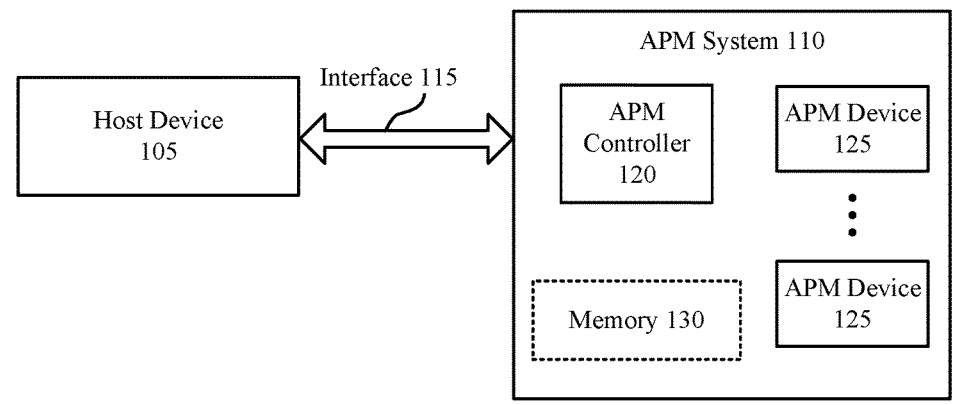
FIG. 1 illustrates an example of a system that supports redundant computing across planes in accordance with examples as disclosed herein.
Figure 1:
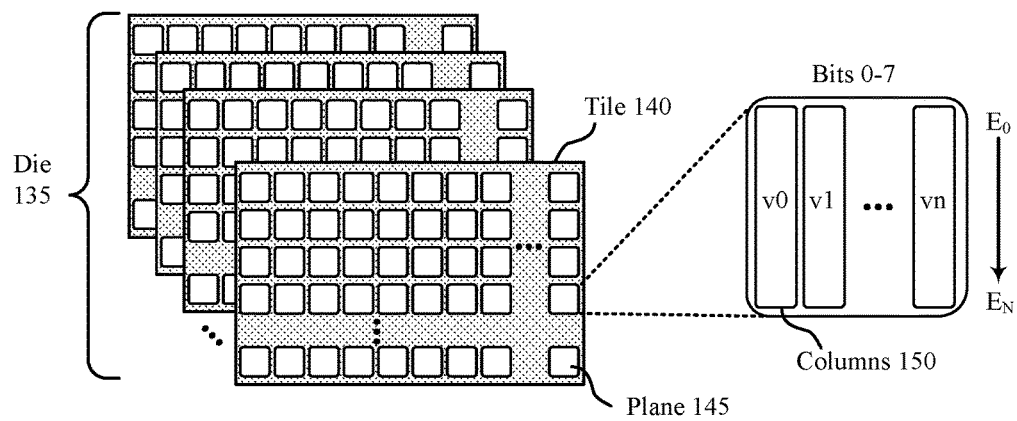

In some systems, a host device may offload various processing tasks to an electronic device, such as an accelerator. For example, a host device may offload computations, such as vector computations or scalar computations, to the electronic device, which may use compute engines and processing techniques to perform the computations. Such offloading of computations may involve communication of operands or operand information from the host device to the electronic device, and in turn communication of results from the electronic device to the host device. Thus, the bandwidth of the electronic device may be constrained by the communication interface between the electronic device and the host device, as well as the size and serial processing of the compute engines. According to the techniques described herein, a host device may essentially increase processing bandwidth by offloading processing tasks to an associative processor memory (APM) system that uses, among other aspects, in-memory associative processing to perform data-parallel computations.

For example, some systems may use associative processing to perform an arithmetic operation on an operand for the arithmetic operation (e.g., the systems may produce a result from one or more vector or scalar operands present or not in the system). Such systems may perform the arithmetic operation on a serial, bit-by-bit basis so that arithmetic output bits (e.g., carry bits, borrow bits) based on less significant bits are available for performing the arithmetic operation on more significant bits. But performing an arithmetic operation on a serial basis may increase the latency of the arithmetic operation, among other disadvantages. Put another way, a subset of operations, such as arithmetic operations, may be, by nature, bit-serial in associative processing because they are based on search-update sequences that consume the carry/borrow bits produced by search-update operations based on less significant bits. As a consequence, the longer the vector element length, the higher the latency of the arithmetic operation.

According to the techniques described herein, an APM system may reduce latency for a computational operation, such as an arithmetic operation, by performing redundant computational operations for a vector operand in parallel. For example, the APM system may use a first set of planes to perform the computational operation based on (e.g., assuming) a first value (e.g., 0) for each arithmetic output bit (e.g., carry bit, borrow bit). In parallel, the APM system may use a second set of planes to perform the computational operation based on (e.g., assuming) a second value (e.g., 1) for each arithmetic output bit (e.g., carry bit, borrow bit). The APM system may then replace the incorrect results from the first set of planes with the correct results from the second set of planes so that all the results in the first set of planes are correct. Alternatively, the APM system may reconstruct the correct result by flagging the correct bits in each plane based on the computed carry/borrow bits from less significant bits. Thus, reconstruction may or may not involve data movement (e.g., the reconstruction may be done by tracking where the correct results are across the planes). By performing redundant computing as described herein, the APM system may reduce the latency of arithmetic (e.g., bit-serial) operations.

Features of the disclosure are initially described in the context of systems and vector computation as described with reference to FIGS. 1 and 2. Features of the disclosure are described in the context of planes and a process flow as described with reference to FIGS. 3-6. These and other features of the disclosure are further illustrated by and described with reference to an apparatus diagram and flowcharts that relate to redundant computing across planes as described with reference to FIGS. 7-10.

FIG. 1 illustrates an example of a system 100 that supports redundant computing across planes in accordance with examples as disclosed herein. The system 100 may include a host device 105 and an associative processing memory (APM) system 110. The host device 105 may interact with (e.g., communicate with, control) the APM system 110 as well as other components of the device that includes the APM system 110. In some examples, the host device 105 and the APM system 110 may interact over the interface 115, which may be an example of a Compute Express Link (CXL) interface or other type of interface.

In some examples, the system 100 may be included in, or coupled with, a computing device, an electronic device, a mobile computing device, or a wireless device. The device may be a portable electronic device. For example, the device may be a computer, a laptop computer, a tablet computer, a smartphone, a cellular phone, a wearable device, an internet-connected device, or the like. The host device 105 may be or include a system-on-a chip (SoC), a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the host device 105 may be referred to as a host, a host system, or other suitable terminology.

The APM system 110 may operate as an accelerator (e.g., a high-speed processor) for the host device 105 so that the host device 105 can offload various processing tasks to the APM system 110, which may be configured to execute the processing tasks faster than the host device 105. For example, the device 105 may send a program (e.g., a set of instructions, such as Reduced Instruction Set V (RISC-V) vector instructions) to the APM system 110 for execution by the APM system 110. As part of the program, or as directed by the program, the APM system 110 may perform various computational operations on vectors (e.g., the APM system 110 may perform vector computing). A computational operation may refer to a logic operation, an arithmetic operation, or other types of operations that involve the manipulation of vectors. A vector may include one or more elements, which may also be referred to as vector elements, each having a respective quantity of bits. The length or size of a vector may refer to the quantity of elements in the vector and the length or size of an element may refer to the quantity of bits in the element.

The APM controller 120 may be configured to interface with the host device 105 on behalf of the APM devices 125. Upon receipt of a program from the host device 105, the APM controller 120 may parse the program and direct or otherwise prompt the APM devices 125 to perform various computational operations associated with or indicated by the program. In some examples, the APM controller 120 may retrieve (e.g., from the memory 130) the vectors for the computational operations and may communicate the vectors to the APM devices 125 for associative processing. In some examples, the APM controller 120 may indicate the vectors for the computational operations to the APM devices 125 so that the APM devices 125 can retrieve the vectors from the memory 130. In some examples, the host device 105 may provide the vectors to the APM system 110. So, the memory 130 may be configured to store vectors that are accessible by the APM controller 120, the APM device 125, the host device 105, or a combination thereof.

The vectors for computational operations at the APM devices 125 may be indicated by (or accompanied by) the program received from the host device 105 or by other control signaling (e.g., other separate control signaling) associated with the program. For example, a program that indicates a computational operation for a pair of vectors may include one or more addresses (or one or more pointers to one or more addresses) of the memory 130 where the vectors are stored. Although shown included in the APM system 110, the memory 130 may be external to, but nonetheless coupled with, the APM system 110. Although shown as a single component, the functionality of memory 130 may be provided by multiple memories 130.

The APM devices 125 may include memory cells, such as content-addressable memory cells (CAMs) that are configured to store vectors (e.g., vector operands, vector results) associated with computational operations. A vector operand may be a vector that is an operand for a computational operation (e.g., a vector operand may be a vector upon which the computation operation is executed). A vector result may be a vector that results from a vector computation.

The APM system 110 may be configured to store information, such as truth tables, for various computational operations, where information (e.g., a truth table) for a given computational operation may indicate results of the computational operation for various combinations of logic values. For example, the APM system 110 may store information (e.g., one or more truth tables) for logic operations (e.g., AND operations, OR operations, XOR operations, NOT operations, NAND operations, NOR operations, XNOR operations) as well as arithmetic operations (e.g., addition operations, subtraction operations), among other types of operations. Memory cells that store information (e.g., one or more truth tables) for a computational operation may store the various combinations of logic values for the operands of the computational operation as well as the corresponding results and carry bits, if applicable, for each combination of logic values. The APM system 110 may store truth tables for associative processing in one or more memories (e.g., in one or more on-die mask ROM(s)) which may be coupled with or included in the APM system 110. For example, the truth tables may be stored in the memory 130, in local memories of the APM devices 125, or both. In either example, an APM device 125 may cache common instructions on-device (e.g., instead of fetching them or receiving them).

At least some APM devices 125, if not each APM device 125, may use associative processing to perform computational operations on the vectors stored in that APM device 125. Unlike serial processing (where vectors are moved back and forth between a processor and a memory), associative processing may involve searching and writing vectors in-memory (also referred to as "in-situ"), which may allow for parallelism that increases processing bandwidth. Performance of computational operations in-situ may also allow the system 100 to, among other advantages, avoid the bottleneck at the interface between the host device 105 and the APM system 110, which may reduce latency and power consumption compared to other processing techniques, such as serial processing. Associative processing may also be referred to as associative computing or other suitable terminology.

In some examples, an APM device 125 that uses associative processing to perform a computational operation may leverage information, such as a truth table, to execute the computational operation in a bit-wise manner using, for example, a "search and write" technique. For example, if the APM device 125 includes CAM cells that store vector operands for a computational operation, the APM device 125 may search the CAM cells for bits of the vector operands that match an entry of the truth table corresponding to that computational operation, determine the result of the computational operational for the bits based on the matching entry of the truth table, and write the result back in the content-addressable memory. The APM device 125 may then proceed to the next significant bits for the vectors and use associative processing to perform the computational operation on those bits. In some examples, the computational operation for bits may involve an arithmetic output bit (e.g., a carry bit, a borrow bit) bit that was determined as part of the computational operation on less significant bits.

Each APM device 125 may include one or more dies 135, which may also be referred to as memory dies, semiconductor dies, or other suitable terminology. A die 135 may include multiple tiles 140, which in turn may each include multiple planes 145. In some examples, the tiles 140 may be configured such that a single plane 145 per tile is operable or activatable at a time (e.g., one plane per tile may perform associative computing at a time). However, any quantity of tiles 140 may be active at a time (e.g., any quantity of tiles may be performing associative computing at a time). Thus, the tiles 140 may be operated in parallel, which may increase the quantity of computational operations that can be performed during a time interval, which in turn may increase the bandwidth of an APM device 125 relative to other different techniques. Use of multiple APM devices 125, as opposed to a single APM device 125, may further increase the bandwidth of the APM system 110 relative to other systems. Each APM device 125 may include a local controller or logic that controls the operations of that APM device 125.

Each plane 145 may include a memory array that includes memory cells, such as CAM cells. The memory cells in a memory array may be arranged in columns and rows and may be non-volatile memory cells or volatile memory cells. A memory array that includes CAM cells may be configured to search the CAM cells by content as opposed to by address. For example, a memory array that includes CAM cells storing vectors for a computational operation may compare the logic values of the operand bits of the vectors with entries from a truth table associated with the computational operation to determine which results correspond to those logic values.

As noted, an APM device 125 may be configured to store vectors associated with computational operations in the memory cells of that APM device 125. To aid in associative processing, the vectors may be stored in a columnar manner across multiple planes. For example, given a vector v0 that has multiple n-bit (e.g., n=32) elements (denoted $E_0$ through $E_N$), an APM device 125 may divide each element into sets of contiguous bits (e.g., four sets of eight contiguous bits). The APM device 125 may store the first set of contiguous bits (e.g., the least significant set of contiguous bits) for each element of vector v0 in a first plane 145, where each row of the plane 145 stores the first set of contiguous bits for a respective element of the vector v0. Thus, in some examples, the columns 150 may store the first eight bits of each element of the vector v0 (e.g., the columns 150 may span eight columns). In a similar manner, the APM device 125 may store the next significant set of contiguous bits from each element of the vector v0 in a second plane 145. And so on and so forth for the remaining sets of contiguous bits for the vector v0. Thus, the vector v0 may be stored in a columnar manner across multiple planes. The bits of other vectors v1 through vn may be stored in a similar columnar manner across the planes 145.

Spreading vectors across multiple planes using the columnar storage technique may allow an APM device 125 to store more vectors per plane 145 relative to other techniques, which in turn may allow the APM device 125 to operate on more combinations of vectors compared to the other techniques. For example, consider a plane that is 256 rows by 256 columns. Rather than storing eight vectors with 32-bit elements across a single plane, which may limit the APM device 125 to operating on those eight vectors (absent time-consuming vector movement), the APM device 125 may store 32 vectors with 32-bit elements across four planes, which allows the APM device 125 to operate on those 32 bit vectors (e.g., one plane at a time) without performing time-consuming vector movement.

In some examples, the APM devices 125 may store vectors according to a vector mapping scheme, which may be one of multiple vector mapping schemes supported by the APM devices 125. A vector mapping scheme may refer to a scheme for mapping (and writing) vectors to planes 145 of an APM device 125. For example, an APM device 125 may support a first vector mapping scheme, referred to as vector mapping scheme 1, and a second vector mapping scheme, referred to as vector mapping scheme 2. In vector mapping scheme 1, a vector may be spread across planes of the same tile 140. In vector mapping scheme 2, a vector may be spread across planes of different tiles 140. A vector mapping scheme may also be referred to as a storage scheme, a layout scheme, or other suitable terminology.

The APM system 110 may select between the vector mapping schemes before writing vectors to the APM devices 125 according to the selected vector mapping scheme. For example, the APM system 110 may select the vector mapping scheme for a set of computational operations based on the sizes of the vectors associated with the set of computational operations, the types of the computations operations (e.g., arithmetic versus logic) in the set of computational operations, a quantity of the computational operations in the set, or a combination thereof, among other aspects. In some examples, the APM system 110 may select the vector mapping scheme in response to an indication of the vector mapping scheme provided by the host device 105. For example, the host device 105 may indicate the vector mapping scheme associated with a set of instructions for the set of computational operations. After vectors have been written to the APM devices 125 according to the selected vector mapping scheme, the APM devices 125 may use associative processing to perform computational operations on the vectors in accordance with the selected vector mapping scheme. Alternatively, a compiler or pre-processor may determine the vector mapping scheme.

The associative processing techniques described herein may be implemented by logic at the APM system 110, by logic at the APM devices 125, or by logic that is distributed between the APM system 110 and the APM devices 125. The logic may include one or more controllers, access circuitry, communication circuitry, or a combination thereof, among other components and circuits. The logic may be configured to perform aspects of the techniques described herein, cause components of the APM system 110 and/or the APM devices 125 to perform aspects of the techniques described herein, or both.

In some examples (e.g., if the vector element length is larger than the quantity of the columns 150), a vector may be distributed across multiple planes 145 of an APM device 125. In such an example, the APM device 125 may perform a computational operation (e.g., an arithmetic operation) on the vector on a plane-by-plane basis so that arithmetic output bits can be propagated through the planes. But performing a computational operation on a plane-by-plane basis may increase system latency. According to the techniques described herein, an APM device 125 may reduce system latency by using redundant planes (e.g., planes storing duplicated data representative of the same vector(s)) and performing the computational operation in parallel across the redundant planes based on different values for arithmetic output bits (e.g., carry bits, borrow bits).

Figure 2:
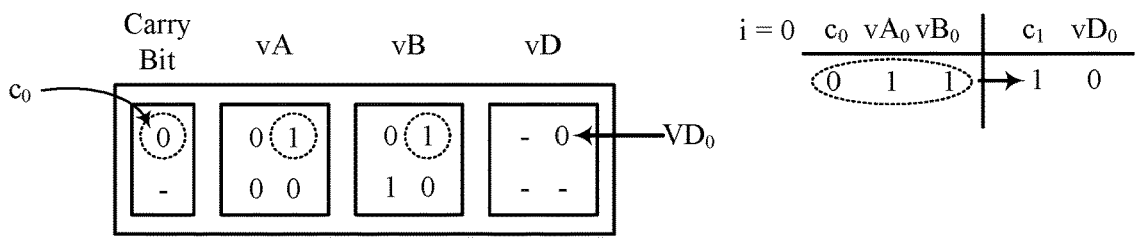
FIG. 2 illustrates an example of a vector computation that supports redundant computing across planes in accordance with examples as disclosed herein.
Figure 2:
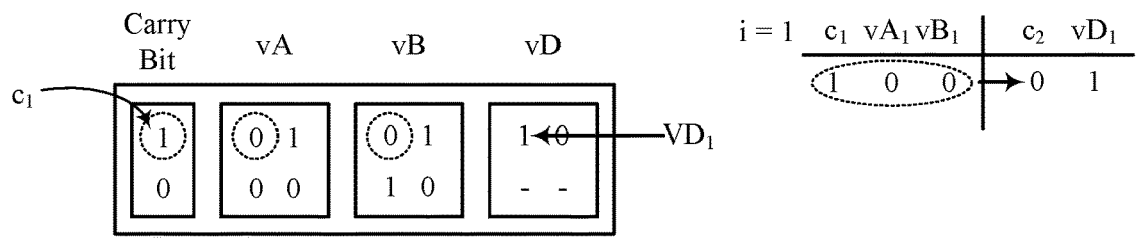
Figure 2:
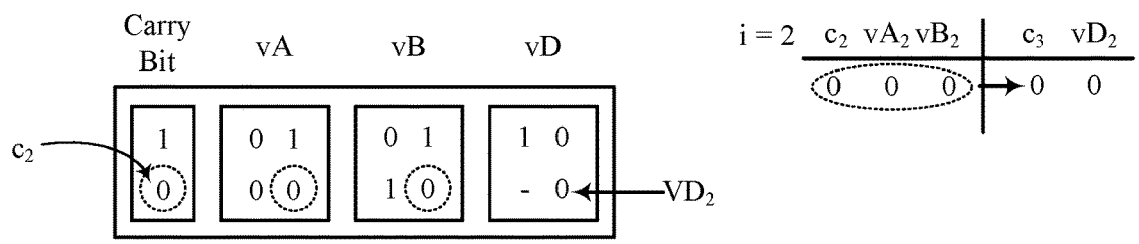
Figure 2:
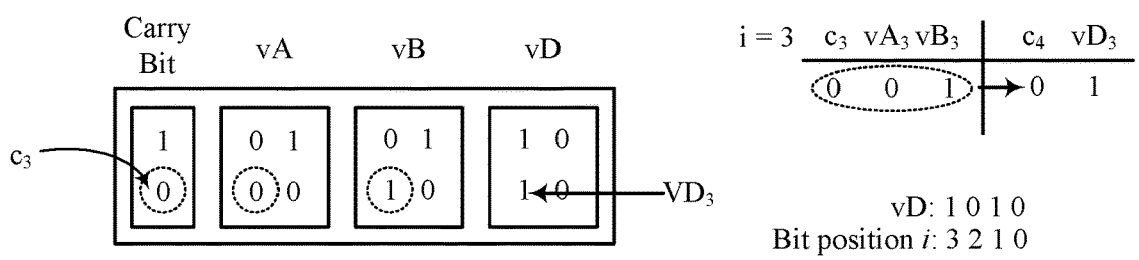

FIG. 2 illustrates an example of a vector computation 200 that supports redundant computing across planes in accordance with examples as disclosed herein. The vector computation 200 may be an example of vector addition and may be performed on operand vectors vA and vB, which may be stored in memory cells (e.g., CAM cells) of a plane of an APM device. The result of the vector addition may be vector vD. Each operand vector may include four bits (e.g., the operand vectors may include a single 4-bit element), and the position of each bit may be denoted i. The operand vectors may be stored in planes of an APM device as discussed with reference to FIG. 1 and may be associated with a set of vector instructions such as RISC-V vector instructions. The vector computation 200 may be performed using truth table 205, which may be the truth table for adding two bits and a potential carry bit. The truth table 205 may be stored in a memory coupled with or included in the APM device, and entries (e.g., rows) of the truth table 205 may be compared to operand bits of the vectors vA and vB using CAM techniques.

The provided example of using associative processing for computational operations on vectors is for illustrative purposes only and is not limiting in any way.

To perform the addition of the vector vA and the vector vB using associative processing, the APM device may retrieve (e.g., using a sequencer) entries of the truth table 205 from memory and compare (e.g., in-situ using CAM techniques) the entries with operand bits of vectors vA and vB. Upon finding a match, the APM device may write the corresponding result (e.g., vDi and carry bit $c_{i+1}$) for the matching entry to the plane storing the vectors (or a different plane) before moving on to the next significant operand bits of the vectors.

For example, for i=0, the APM device may compare the entries of the truth table 205 with the corresponding operand bits (e.g., $c_0$=0, $vA_0$=1, and $vB_0$=0) from vectors vA and vB. Upon detecting a match between the operand bits and an entry of the truth table 205, the APM device may write the result corresponding to the matching entry (e.g., $vD_0$=0 and carry bit $c_1$=1) to the plane storing the operand vectors (or a device may compare the entries from the truth table 205 with the operand bits for i=0 in a serial manner (e.g., starting with the top entry and moving down the truth table 205 one entry at a time). In some examples, the APM device may compare entries from the truth table 205 with multiple operand bits in parallel (e.g., concurrently).

After determining the result for the ith operand bits, the APM device may proceed to the next significant operand bits (which may include the carry bit i+1 carry bit determined from the ith operand bits). For instance, after determining the result for the i=0 operand bits, the APM device may proceed to the i=1 operand bits (which may include the carry bit $c_1$ determined from the i=0 operand bits). However, in some scenarios (e.g., when the computational operation is a logic operation) the APM device may perform computational operations on some or all of the operand bits in parallel.

For i=1, the APM device may compare the entries of the truth table 205 with the corresponding operand bits (e.g., $c_1$=1, $vA_1$=0, and $vB_1$=0) from vectors vA and vB. Upon detecting a match between the operand bits and an entry of the truth table 205, the APM device may write the result corresponding to the matching entry (e.g., $vD_1$=1 and carry bit $c_2$=0) to the plane storing the operand vectors (or a different plane). The APM device may compare the entries from the truth table 205 with the operand bits for i=1 in a serial manner (e.g., starting with the top entry and moving down the truth table 205 one entry at a time). After determining the result for the i=1 operand bits, the APM device may proceed to the i=2 operand bits (which may include the carry bit $c_2$ determined from the i=1 operand bits).

For i=2, the APM device may compare the entries of the truth table 205 with the corresponding operand bits (e.g., $c_2$=0, $vA_2$=0, and $vB_2$=0) from vectors vA and vB. Upon detecting a match between the operand bits and an entry of the truth table 205, the APM device may write the result corresponding to the matching entry (e.g., $vD_2$=0 and carry bit $c_3$=0) to the plane storing the operand vectors (or a different plane). The APM device may compare the entries from the truth table 205 with the operand bits for i=2 in a serial manner (e.g., starting with the top entry and moving down the truth table 205 one entry at a time). After determining the result for the i=2 operand bits, the APM device may proceed to the i=3 operand bits (which may include the carry bit $c_3$ determined from the i=2 operand bits).

For i=3, the APM device may compare the entries of the truth table 205 with the corresponding operand bits (e.g., $c_3$=0, $vA_3$=0, and $vB_3$=1) from vectors vA and vB. Upon detecting a match between the operand bits and an entry of the truth table 205, the APM device may write the result corresponding to the matching entry (e.g., $vD_3$=1 and carry bit $c_4$=0) to the plane storing the operand vectors (or a different plane). The APM device may compare the entries from the truth table 205 with the operand bits for i=3 in a serial manner (e.g., starting with the top entry and moving down the truth table 205 one entry at a time).

Thus, the APM device may use associative processing to determine that adding vA (e.g., 0b0001) and vB (e.g., 0b1001) results in vD=0b1010. After completing the addition operation, the APM device may communicate the vector vD to a host device, use the result vector vD to perform other computational operations, or a combination thereof.

Although an APM device may perform a computational operation on a serial bit-by-bit basis, latency may be reduced if the APM device performs the computational operation on different sets of bits in parallel. For example, if vector vA has a vector element length of sixteen bits, the APM device may divide each vector into four sets of consecutive bits and perform the computational operation on each set of consecutive bits in parallel (but within a set the computational operation may be performed on a serial bit-by-bit basis, as described with reference to FIG. 2). For example, the APM device may perform the computational operation on Set A (bits 0-3), Set B (bits 4-7), Set C (bits 8-11) and Set D (bits 12-15) in parallel, but within each set the APM device may perform the computation operation on a bit-by-bit basis. To account for arithmetic output bits, the APM device may redundantly perform each computational operation using different values for the arithmetic bits (e.g., carry bits, borrow bits). The APM device may then select the correct results from the redundant computational operations based on the actual value of the arithmetic bit (e.g., carry bit, borrow bit) computed by the planes storing less significant bits.

Figure 3:
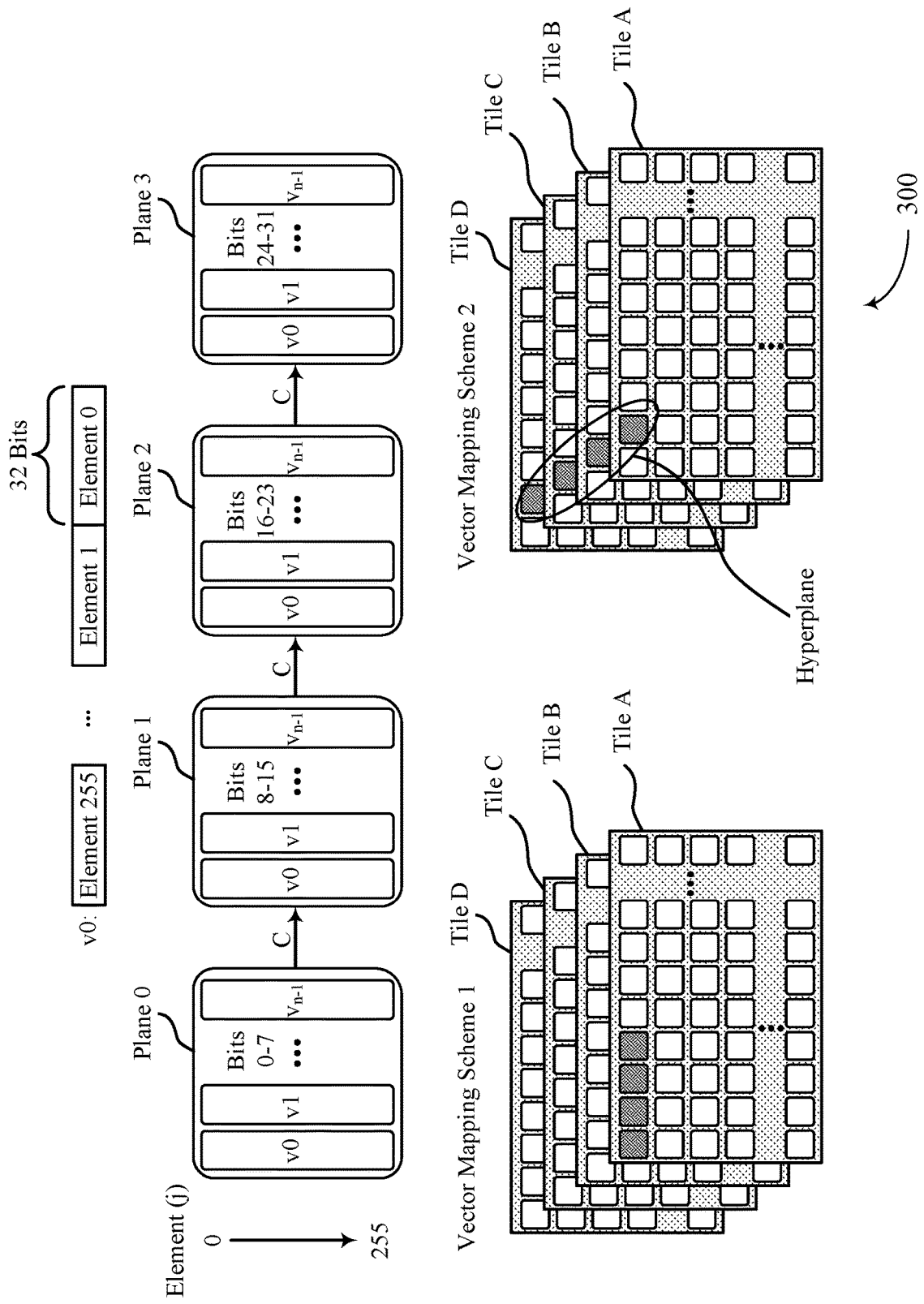
FIG. 3 illustrates an example of planes that support redundant computing in accordance with examples as disclosed herein.

FIG. 3 illustrates an example of planes 300 that supports redundant computing in accordance with examples as disclosed herein. The planes 300 may be examples of planes 145 as described with reference to FIG. 1. Thus, the planes 300 may be configured to store vectors for computational operations that are performed using associative processing. In some examples, the planes 300 may be in the same tile, as discussed with reference to vector mapping scheme 1. In other examples, the planes 300 may be in different tiles, as discussed with reference to vector mapping scheme 2.

In the given example, n vectors with multiple (e.g., 256) multi-bit elements (e.g., 32-bit elements) are mapped to four planes. However, other quantities of these factors are contemplated and within the scope of the present disclosure.

An APM device may map and write n vectors, denoted v0 though $v_{n-1}$, to four planes. The quantity of planes to which vectors are mapped may be a function of the element length and the quantity of bits mapped to each plane. For example, the quantity of planes to which a vector is mapped may be equal to the element length divided by the quantity of bits mapped to each plane. In the given example, the quantity of planes to which the vectors are mapped is four, which is equal to the element length (e.g., 32) divided by the quantity of bits mapped to each plane (e.g., eight).

At least some if not each plane may store a set of contiguous bits from at least some if not each element of at least some if not each vector (e.g., each plane may store a corresponding set of contiguous bits from each element of each vector). For instance, plane 0 may store contiguous bits 0-7 for each element of each vector; plane 1 may store contiguous bits 8-15 for each element of each vector; plane 2 may store contiguous bits 16-23 for each element of each vector; and plane 3 may store contiguous bits 24-31 for each element of each vector. The bits of different vectors may be stored across different columns of the planes, whereas the bits of different elements may be stored across different rows of the planes. For example, the bits from vector 0 may be stored in the first set of eight columns of each plane; the bits from vector 1 may be stored in the second set of eight columns of each plane; the bits from vector 2 may be stored in the third set of eight columns of each plane; and so on and so forth. For each vector, the bits from element may be stored in the first row of a given plane; the bits from element 1 may be stored in the second row of the plane; the bits from element 2 may be stored in the third row of the plane, and so on and so forth.

So, a plane that has x rows (e.g., 256 rows) may be capable of storing vectors with x elements or fewer (vectors with length 256 or less). If a vector has more than x elements, the elements of the vector may be split across multiple planes (e.g., the elements of a vector with length 512 may be stored in two planes, with the first plane storing bits from the first 256 elements and the second plane storing bits from the second 256 elements). So, a system that uses the vector mapping schemes described herein may support vectors with larger sizes than other systems (e.g., serial processing systems) which may be constrained by the size of processing circuitry (e.g., compute engines).

Vectors may be stored according to vector mapping scheme 1 or vector mapping scheme 2. In vector mapping scheme 1, the planes to which a vector is mapped may be in the same tile. For example, plane 0 through plane 3 may be in tile A. In vector mapping scheme 2, the planes to which a vector is mapped may be in different tiles. For example, plane 0 may be in tile A, plane 1 may be in tile B, plane 2 may be in tile C, and plane 3 may be in tile D. Collectively, tiles A through D (e.g., the tiles across which a vector is spread) may be referred to a hyperplane. Both vector mapping schemes may allow an APM device to perform computational operations on multiple vectors in parallel (e.g., during partially or wholly overlapping times). For example, given h tiles, the APM device may perform h different computational operations at once.

So, in vector mapping scheme 1, an APM device may use a single tile to complete a computational operation on a vector. For instance, the APM device may use tile A to perform the computational operation on bits 0-7 of the elements in the vector, may use tile A to perform the computational operation on bits 8-15 of the elements in the vector, may use tile A to perform the computational operation on bits 16-23 of the elements in the vector, and may use tile A to perform the computational operation on bits 24-31 of the elements of the vector. If carry bits arise from the computational operations, the APM device may pass the carry bits (denoted 'C') between the planes of tile A. For example, if a carry bit results from the computational operation on bits 0-7, the APM device may pass that carry bit from plane 0 to plane 1 in tile A.

In vector mapping scheme 2, an APM device may use multiple tiles to complete a computational operation on a vector. For instance, the APM device may use tile A to perform the computational operation on bits 0-7 of the elements in the vector, may use tile B to perform the computational operation on bits 8-15 of the elements in the vector, may use tile C to perform the computational operation on bits 16-23 of the elements in the vector, and may use tile D to perform the computational operation on bits 24-31 of the elements in the vector. If carry bits arise from the computational operations, the APM device may pass the carry bits between the tiles. For example, if a carry bit results from the computational operation on bits 0-7, the APM device may pass that carry bit from tile A to tile B.

The associative processing techniques described herein may be implemented by logic at an APM system, by logic at an APM device, or by logic that is distributed between the APM system and the APM device. The logic may include one or more controllers, access circuitry, communication circuitry, or a combination thereof, among other components and circuits. The logic may be configured to perform aspects of the techniques described herein, cause components of the APM system and/or the APM device to perform aspects of the techniques described herein, or both.

An APM device may be capable of performing computational operations serially or in parallel. If the APM device performs a computational operation serially, the APM device may perform the computational operation on one plane at a time in sequence (e.g., starting with the least significant plane, e.g., plane 0, and ending with the most significant plane, e.g., plane 3). The APM device may perform the computational operation on one plane at a time because the computational operation on plane n may depend on arithmetic output bits that result from the computational operation on plane n−1. But, in some examples, performing a computational operation on one plane at a time may increase latency, among other disadvantages.

According to the techniques described herein, an APM device may reduce latency by performing computational operations in parallel across planes. To do so, in some examples, the APM device may use respective redundant planes for plane 1, plane 2, and plane 3. The redundant planes may store the same bits for the computational operation as plane 1, plane 2, and plane 3. The APM device may use a first possible value (e.g., 0) for arithmetic output bits for plane 1, plane 2, and plane 3, and may use a second possible value (e.g., 1) for arithmetic output bits for the redundant planes. By using different values for the arithmetic output bits, the APM device may perform computational operations on all of the planes (e.g., plane 0 through plane 3, and the redundant planes) without waiting for the computational operation on one or more other planes (e.g., a preceding plane) to finish. After performing the computational operations, the APM device may determine the actual (e.g., computed) values for the arithmetic output bits and select the results of the computational operations from the planes used the correct possible values for the arithmetic output bits.

Figure 4:
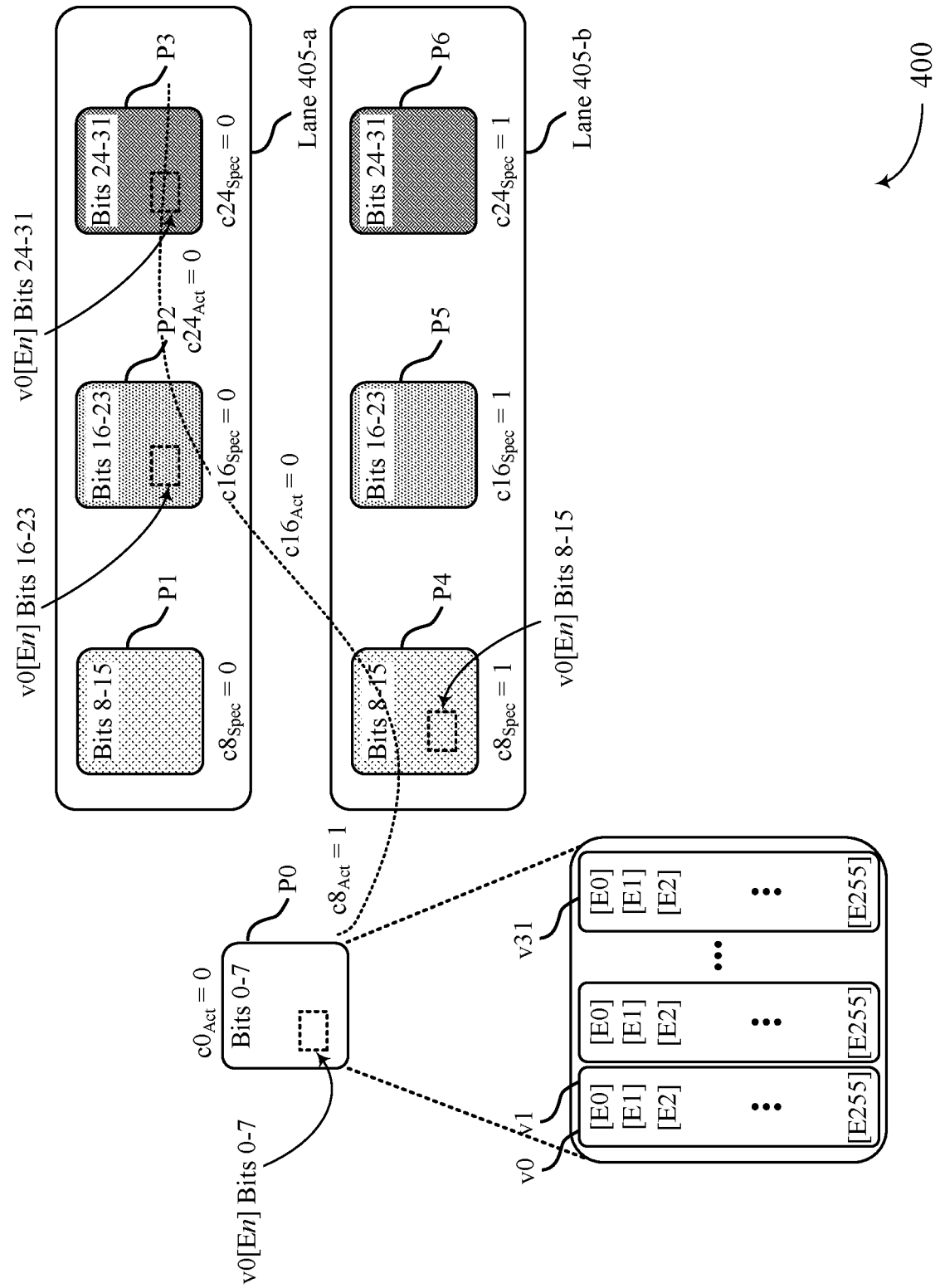
FIG. 4 illustrates an example of planes that support redundant computing in accordance with examples as disclosed herein.

FIG. 4 illustrates an example of planes 400 that support redundant computing in accordance with examples as disclosed herein. The planes 400 may include planes P0 through P6. Plane P4 may be redundant with plane P0, which means that plane P4 stores the same operand vector element(s) for a computational operation as plane P0. Similarly, P5 may be redundant with plane P1 (such that plane P5 stores the same operand vector element(s) for the computational operation as plane P2), and plane P6 may be redundant with plane P3 (such that plane P6 stores the same operand vector element(s) for the computational operation as plane P3). Planes that store the same operand vector elements for a computational operation may be referred to as sister planes or redundant planes, and are shown with matching shading in FIG. 4. Planes P1, P2, and P3 may form a first lane of planes (lane 405-*a*) and planes P4, P5, and P6 may form a second lane of planes (lane 405-*b*). The planes P0 through P6 may be in the same tile (e.g., in accordance with Layout 1) or in different tiles (e.g., in accordance with Layout 2). For example, each plane may be in Tile A, or the planes may be distributed across tiles so that each plane is in a respective tile.

Each plane may store sets of contiguous bits for elements of vectors. For example, plane P0 may store contiguous bits 0-7 for each element of vectors v0 through v31. Plane P1 and plane P4 may each store contiguous bits 8-15 for each element of vectors v0 through v31. Plane P2 and plane P5 may each store contiguous bits 16-23 for each element of vectors v0 through v31. And plane P3 and plane P6 may each store contiguous bits 24-31 for each element of vectors v0 through v31. Although shown with 32 vectors, 256 elements per vector, and 8 bits per element, other quantities of vectors, elements, and bits are contemplated and within the scope of the present disclosure.

The APM device that includes planes P0 through P6 may use redundant computing to decrease the latency of computational operations. For example, the APM device may use redundant computing to reduce the latency of a computational operation (e.g., an addition operation) on operand vectors v0 and v1. For ease of illustration, the computational operation is described with reference to a single element of vector v0. However, the techniques described herein may be extended to multiple elements of vectors v0 and v1, including all the elements of vectors v0 and v1. Although described with reference to two operand vectors (v0 and v1), the techniques described herein may be implemented for any quantity of operand vectors.

To perform redundant computing, the APM device may use a first value (e.g., 0) for speculative carry bits that act as input bits for planes P0, P1, and P2. The APM device may use a second value (e.g., 1) for speculative carry bits that act as input bits for planes P4, P5, and P6. The speculative carry bit for a plane may represent the actual carry bit from a less significant plane in a lane 405 of planes and may be assigned a possible value for the actual carry bit. For example, the speculative carry bits $c8_{Spec}$ may represent the actual carry bits from bits 0-7, the speculative carry bits $c16_{Spec}$ may represent the actual carry bits from bits 8-15, and the speculative carry bit $c24_{Spec}$ may represent the actual carry bits from bits 16-23. The actual carry bit for a plane may refer to the carry bit that is determined based on the bits in the preceding (e.g., less significant) plane, as opposed to a speculative carry bit which is set to one of two possible values irrespective of the bits in the preceding plane. The actual carry bits $c8_{Act}$, $c16_{Act}$, and $c24_{Act}$ may be referred to as output bits or arithmetic output bits. Although described with reference to carry bits, the APM device may use redundant computing as described herein for other types of arithmetic output bits.

By using speculative carry bits and redundant planes, the APM device may perform the computational operation on each plane in parallel (e.g., concurrently, at wholly or partially overlapping times). Specifically, the APM device may use actual carry bit c0 (denoted $c0_{ACT}$) to perform the computational operation on bits 0-7 of element n (denoted [En]) for vector v0 in plane 0. Concurrently, the APM device may: 1) use speculative carry bit $c8_{Spec}=0$ (e.g., a first possible value for $c8_{Act}$) to perform the computational operation on bits 8-15 of element n for vector v0 in plane 1, and 2) use speculative carry bit $c8_{Spec}=1$ (e.g., a second possible value for $c8_{Act}$) to perform the computational operation on bits 8-15 of element n for vector v0 in plane 4. Also concurrently, the APM device may: 1) use speculative carry bit $c16_{Spec}=0$ (e.g., a first possible value for $c16_{Act}$) to perform the computational operation on bits 16-23 of element n for vector 0 in plane 2, and 2) use speculative carry bit $c16_{Spec}=1$ (e.g., a second possible value for $c16_{Act}$) to perform the computational operation on bits 15-23 of element n for vector v0 in plane 5. Also concurrently, the APM device may: 1) use speculative carry bit $c24_{Spec}=0$ (e.g., a first possible value for $c24_{Act}$) to perform the computational operation on bits 24-31 of element n for vector v0 in plane 3, and 2) use speculative carry bit $c24_{Spec}=1$ (e.g., a second possible value for $c24_{Act}$) to perform the computational operation on bits 24-31 of element n for vector v0 in plane 6.

The APM device may use associative processing to perform the computational operations. For example, the APM device may search the vector operand(s) for bit values that match the entries of a truth table for the computational operation, then determine the results for the computational operation based on the corresponding results from the truth table. Thus, the APM device may perform the computational operations based on a capability (e.g., the search-and-replace capability) of the content-addressable memory cells used to store the vector operands.

After performing the computational operation for a plane the APM device may store the results of the computational operation, for example, in that plane. For example, the APM device may store the results from the computational operation on bits 0-7 in the content-addressable memory cells for vector v31 in plane P0. And so on and so forth for the other planes. In some examples, the APM device may also store the actual carry bits from a plane in the plane (or a local register or other storage device) for later use (e.g., for use during reconstruction).

Thus, unlike in serial computing, the APM device may perform the computational operation on a pair of sister planes before finishing the computational operations on less significant pairs of sister planes, which may decrease latency. However, one plane per sister pair will likely have incorrect results, because only one of the sister planes per pair will have used a speculative carry bit with the correct value (e.g., only one plane will have used a possible value for the actual carry bit $c_{Act}$ that matches the value of the actual carry bit $c_{Act}$). For instance, if the actual carry bit $c8_{Act}$ is equal to 1, plane P4 will have the correct results for the computational operation on bits 8-15 (because plane P4 used the $c8_{Spec}=1$, which matches $c8_{Act}$) and plane P1 will have incorrect results (because plane P1 used $c8_{Spec}=0$, which does not match $c8_{Act}$).

So, only one sister plane may store the correct results for the computational operation on an element of a vector. To illustrate, consider the example in which $c8_{Act}=1$, $c16_{Act}=0$, and $c24_{Act}=0$ (e.g., for element n). In this example, the planes with the correct results (as indicated by the dotted line) for element n of vector v0 are plane P4 (which used $c8_{Spec}=1$), plane P2 (which used $c16_{Spec}=0$), and plane P3 (which used $c_{Spec}24=0$). Put another way, the sister plane with the correct result for a redundant computational operation may be the plane whose possible value matches (e.g., is equal to) the value for the actual carry bit.

Although described with reference to a single element n, the planes 400 may implement redundant computing for each element in the operand vector(s). So, a given sister plane may have correct results for some vector elements but incorrect results for other vector elements (e.g., $c8_{Act}$ may be equal to 0 for element j but may be equal to 1 for element k, resulting in a correct result for element j in plane P0 but an incorrect result for element k in plane P0). To ensure that at least one plane per sister pair has the correct results for each element, the APM device may copy the correct results from one sister plane to the other sister plane, as described in more detail with reference to FIG. 5. Copying correct results between planes (or flagging the correct results across planes) may be referred to as reconstruction. Copying correct results between planes may include to reading the correct results from one sister plane and writing the correct results to the other sister plane.

Thus, the APM device may use redundant computing to perform a computational operation across multiple planes in parallel.

Figure 5:
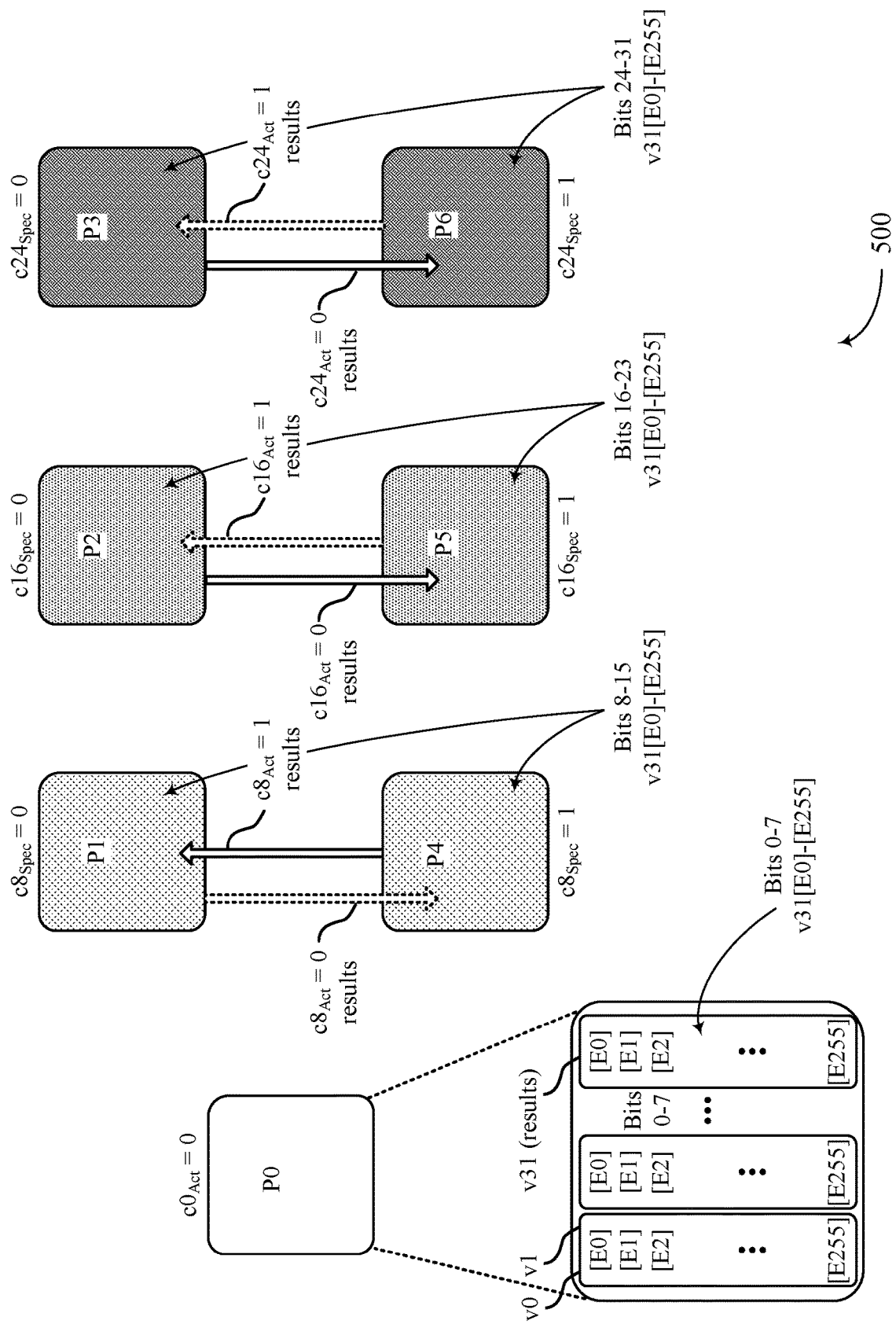
FIG. 5 illustrates an example of planes that support redundant computing in accordance with examples as disclosed herein.

FIG. 5 illustrates an example of planes 500 that support redundant computing across planes in accordance with examples as disclosed herein. The planes 500 may include planes P0 through P6, which may be examples of planes P0 through P6 after performing a computational operation on operand vectors v0 and v1 as described with reference to FIG. 5. For instance, planes P0 through P6 may include portions of vector 31, which may represent the results of the computational operations described with reference to FIG. 5.

So, bits 0-7 of the elements of vector v31 in plane P0 may represent the results of the computational operation on bits 0-7 of the elements of operand vectors v0 and v1. In sister planes P1 and P4, bits 8-15 of the elements of vector v31 may represent the respective results of the computational operations on bits 8-15 of the elements of operand vectors v0 and v1 (e.g., plane P1 may store the results that are based on $c8_{Spec}=0$ (a first possible value for $c8_{Act}$) and plane P4 may store the results that are based on $c8_{Spec}=1$ (a second possible value for $c8_{Act}$)). In sister planes P2 and P5, bits 16-23 of the elements of vector v31 may represent the respective results of the computational operations on bits 16-23 of the elements of operand vectors v0 and v1 (e.g., plane P2 may store the results that are based on $c16_{Spec}=0$ (a first possible value for $c16_{Act}$) and plane P5 may store the results that are based on $c16_{Spec}=1$ (a second possible value for $c16_{Act}$)). And in sister planes P3 and P4, bits 24-31 of the elements of vector v31 may represent the respective results of the computational operations on bits 24-31 of the elements of operand vectors v0 and v1 (e.g., plane P3 may store the results that are based on $c24_{Spec}=0$ (a first possible value for $c24_{Act}$) and plane P6 may store the results that are based on $c24_{Spec}=1$ (a second possible value for $c24_{Act}$)).

The results of each computational operation may be stored in the planes P0 through P6. However, as noted, it is likely that at least some results in each plane will be incorrect. To ensure that at least one sister plane has the correct results for each element, the APM device may read correct results from one sister plane and write them to the other sister plane. For example, if plane P4 stores the correct result for element 17, the APM device may read the correct result from element 17 in plane P4 and write the correct results to element 17 in P1 (thus overwriting the incorrect result for element 17 in P1).

The APM device may determine which results are correct by comparing the value of the actual carry bit for an element with the value used for the speculative carry bit for that element. For example, the APM device may determine that the result for an element is the correct result if the result was computed using a speculative carry bit value that matches (e.g., is equal to) the value of the actual carry bit for that element. To illustrate, if the actual carry bit $c8_{Act}$ for an element has a value equal to 1, the APM device may determine that the correct results for the element are in plane P4 (because plane P4 used $c8_{Spec}=1$).

In some examples, the APM device may copy the correct results in a single direction for a pair of sister planes (e.g., from one sister plane to the other, but not vice versa). For example, the APM device may copy the correct results from plane P4 to plane P1, but not from plane P1 to plane P4. Copying correct results in a single direction for a pair of sister planes may reduce reconstruction latency (e.g., the amount of time it takes to fill one of the sister planes with correct results) relative to other techniques but may leave one sister plane with incorrect results for some elements. In other examples, the APM device may copy the correct results in both directions (e.g., the correct results from each plane may be copied to the other plane). For example, the APM device may copy the correct results from plane P4 to plane P1 as well as the correct results from plane P1 to plane P4. Copying correct results in both directions for a pair of sister planes may ensure that each sister plane has correct results for each element but may increase reconstruction latency relative to other techniques.

If the APM device copies correct results in a single direction for a pair of sister planes, the APM device may select the direction based on the ratio of elements with correct results to elements with incorrect results. For example, the APM may determine the sister plane with the lowest ratio of correct results to incorrect results as the donating plane, where a donating plane is the plane from which correct results are copied. By selecting the sister plane with the lowest ratio of correct results to incorrect results as the donating plane, the APM device may decrease the reconstruction latency relative to using the other sister plane as the donating plane (because fewer elements need to be copied). For example, if plane P4 has 56 correct results and plane P1 has 200 correct elements, the APM device may reduce reconstruction time by copying the 56 correct results from plane P4 to plane P1 (compared to copying 200 correct results from plane P1 to plane P4).

Rather than copy correct results between sister planes, the APM device may, in some examples, copy correct results from each pair of sister planes to a new plane. For example, the APM device may copy the correct results from plane P1 and plane P4 to a new plane P7 (not shown). Similarly, the APM device may copy the correct results from plane P2 and plane P5 to a new plane P8 (not shown). And the APM device may copy the correct results from plane P3 and plane P6 to a new plane P9 (not shown). Alternatively, the APM device may copy the correct results from each pair of sister planes to a different pair of sister planes. For example, the APM device may copy the correct results from plane P1 and plane P4 to plane P2 and/or plane P5. Similarly, the APM device may copy the correct results from plane P2 and plane P5 to plane P3 and/or plane P6. And the APM device may copy the correct results from plane P3 and plane P6 to plane P1 and plane P4.

In some examples, the APM device may copy the results between planes on a bit-serial row-parallel basis. For example, the APM device may copy (in parallel) the least significant bit from each correct element in a sister plane to the other sister plane, then copy (in parallel) the next significant bit from each correct element, and so on and so forth. Alternatively, the APM device may copy the results between planes on bit parallel, row-serial basis. For example, the APM device may copy (in parallel) the bits from the least significant correct element in a sister plane to the other sister plane, then copy (in parallel) the bits from the next significant correct element, and so on and so forth.

Thus, the APM device may collect the corrects results for a computation operation in one or more planes by copying the correct bits between planes. Alternatively, the APM device may reconstruct the correct results by flagging the correct bits in each plane (rather than copying the correct bits between planes). This way, the APM device can reference the flags to determine the correct bits in each plane to operate during a subsequent operation.

Figure 6:
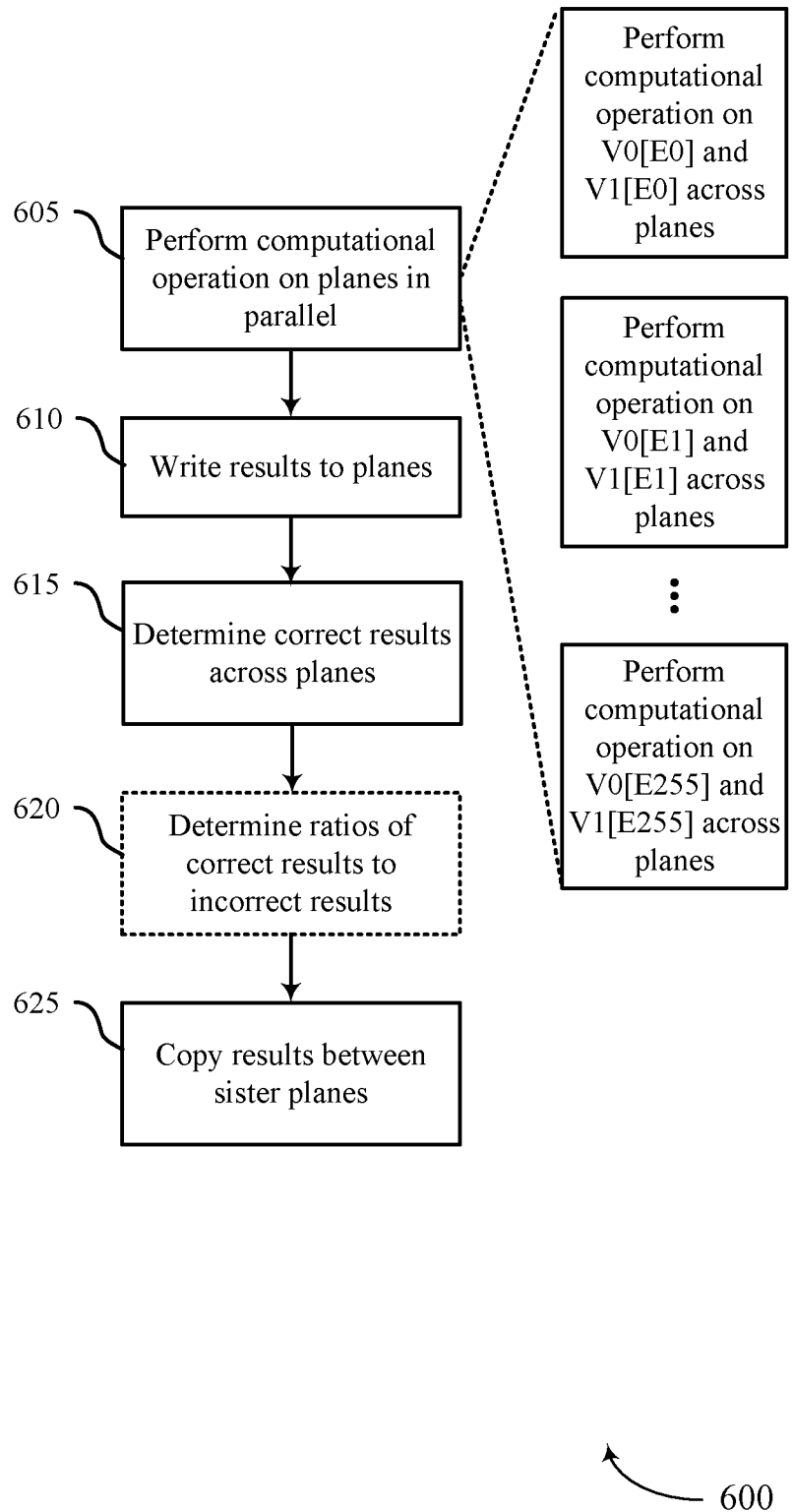
FIG. 6 illustrates an example of a process flow that supports redundant computing across planes in accordance with examples as disclosed herein.

FIG. 6 illustrates an example of a process flow 600 that supports redundant computing across planes in accordance with examples as disclosed herein. The process flow 600 may be implemented by an APM system or an APM device as described herein.

At 605, the APM device may perform (e.g., using associative processing) a computational operation on a set of operand vectors (e.g., v0 and v1). The APM device may perform the computational operation using a set of planes (e.g., planes P0 through P6) as described with reference to FIG. 4. For example, the APM device may perform the computational operation in some planes (e.g., planes P1, P2, and P3) using a first possible value for actual carry bits (e.g., $c_{Spec}=0$) and may perform the computational operation in other planes (e.g., planes P4, P5, and P6) using a second possible value for the actual carry bits (e.g., $c_{Spec}=1$).

The APM device may perform the computational operation across the set of planes on an element-by-element basis. For example, the APM device may concurrently perform the computational operation on element (denoted E[0]) in each plane of the set of planes. The APM device may then concurrently perform the computational operation on element 1 (denoted [E1]) in each plane of the set of planes. And so on and so forth. Thus, the APM device may, in some examples, perform the computational operation on the elements in a serial manner but may perform the computational operation on planes in a parallel manner. Performing the computational operation on the vectors may allow the APM device to determine the results for the computational operation on each element as well as the value of actual carry bits for the computational operation.

At 610, the APM device may write the results of the computational operations to the set of planes. For example, the APM device may write the results from plane P0 to plane P0, may write the results from plane P1 to plane P1, may write the results from plane P2 to plane P2, and so on and so forth. In some examples, the APM device may write the results for a computational operation on an element (e.g., [Ex]) before performing the computational operation on the next element (e.g., [Ex+1]. Put another way, the operations of 610 may overlap with the operations of 605.

At 615, the APM device may determine the correct results for each element across the planes. For example, the APM device may determine which of plane P0 and plane P4 has the correct results for element, which of plane P0 and plane P4 has the correct results for element 1, which of plane P0 and P4 has the correct results for element 2, and so on and so forth for each element and each pair of sister planes. The sister plane that used the correct possible value for the actual carry bit (e.g., $c_{Spec}=c_{Act}$) of an element may be the plane with the correct results for that element.

At 620, the APM device may determine, for one or more pairs of sister planes or for each pair of sister planes, the ratio of correct results to incorrect results. For example, the APM device may determine the ratio of correct results to incorrect results for plane P0 to be 56/200 and may determine the ratio of correct results to incorrect results for plane P1 to be 200/56. Alternatively, the APM device may determine the quantity of correct results (or the quantity of incorrect results) for each plane of a pair of sister planes.

At 625, the APM device may copy correct results between sister planes (e.g., the APM device may perform reconstruction). For example, the APM device may copy the correct results from plane P1 to plane P4. The APM device may copy the correct results from the sister plane with the lowest ratio of correct results to incorrect results (e.g., the sister plane with the fewest correct results). Alternatively, the APM device may copy the correct results from each sister plane to the other sister plane. Alternatively, the APM device may copy the correct results from each sister plane to a new plane. Alternatively, the APM device may copy the correct results from each sister plane to one or more of the sister planes in the next significant pair of sister planes.

Thus, the APM device may use redundant planes and associative processing to perform a computational operation across multiple planes in parallel, which may reduce latency.

Figure 7:
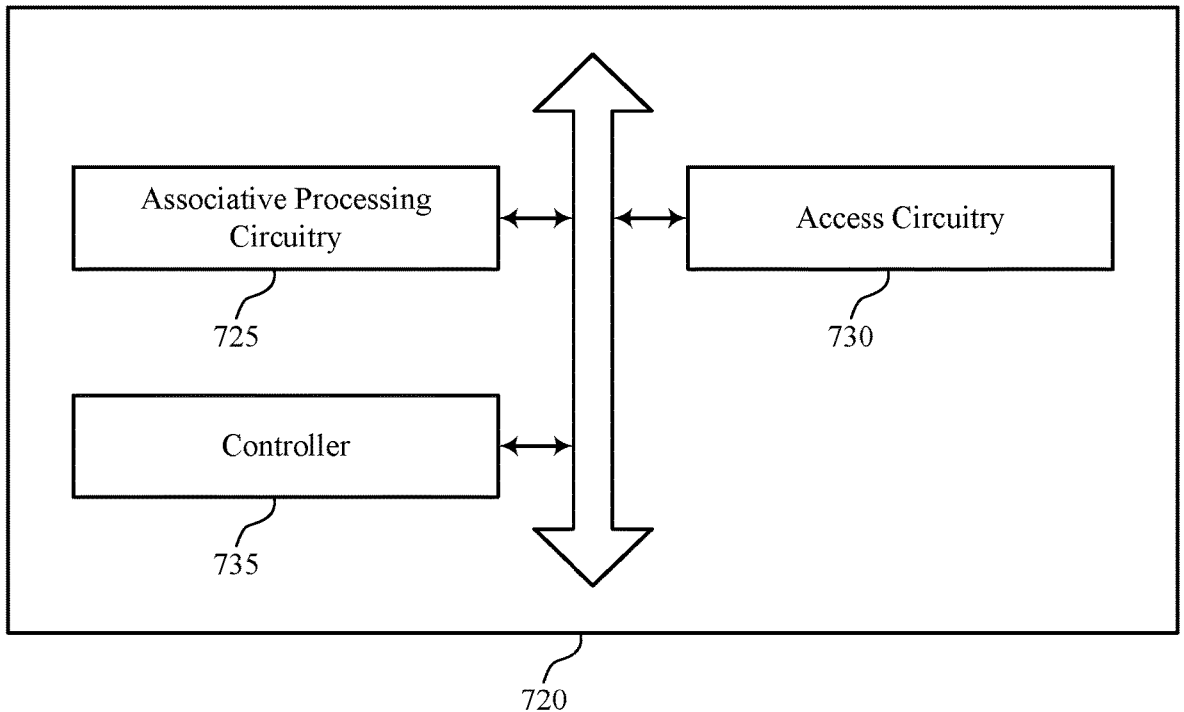
FIG. 7 shows a block diagram of a device that supports redundant computing across planes in accordance with examples as disclosed herein.

FIG. 7 shows a block diagram 700 of a device 720 that supports redundant computing across planes in accordance with examples as disclosed herein. The device 720 may be an example of aspects of a device as described with reference to FIGS. 1 through 6. The device 720, or various components thereof, may be an example of means for performing various aspects of redundant computing across planes as described herein. For example, the device 720 may include an associative processing circuitry 725, an access circuitry 730, a controller 735, or any combination thereof. Each of these components may communicate, directly or indirectly, with one another (e.g., via one or more buses).

The associative processing circuitry 725 may be configured as or otherwise support a means for performing (e.g., using associative computing) a computational operation on first data that is stored in a first plane (e.g., plane P1) of a plurality of planes including content-addressable memory cells, where the computational operation is based at least in part on a capability of the content-addressable memory cells, and where the first data is representative of a set of contiguous bits of a vector (e.g., bits 8-15 of vector v0). In some examples, the associative processing circuitry 725 may be configured as or otherwise support a means for performing, (e.g., using associative computing) concurrent with performing the computational operation on the first data, the computational operation on second data that is stored in a second plane (e.g., plane P4), where the second data is representative of the set of contiguous bits of the vector (e.g., bits 8-15 of vector v0). The access circuitry 730 may be configured as or otherwise support a means for reading from the first plane and writing to the second plane, third data representative of a result of the computational operation on the first data.

In some examples, the controller 735 may be configured as or otherwise support a means for determining a value of an output bit (e.g., $c8_{Act}$) based at least in part on a second set of contiguous bits of the vector (e.g., bits 0-7 of vector v0) that is less significant than the set of contiguous bits, where the third data is copied from the first plane to the second plane based at least in part on the value for the output bit.

In some examples, the computational operation on the first data is based at least in part on a first value for the output bit, and the controller 735 may be configured as or otherwise support a means for determining that the value of the output bit is equal to the first value, where the third data is copied from the first plane to the second plane based at least in part on the value being equal to the first value.

In some examples, the access circuitry 730 may be configured as or otherwise support a means for performing (e.g., using associative computing) the computational operation on fourth data representative of the second set of contiguous bits (e.g., bits 0-7 of vector v0), where the value for the output bit is based at least in part on performing the computational operation on the fourth data.

In some examples, the fourth data is stored in a third plane. In some examples, the computational operation on the fourth data is performed concurrent with the computational operations on the first data and the second data.

In some examples, the access circuitry 730 may be configured as or otherwise support a means for writing the third data to the first plane based at least in part on performing the computational operation on the first data. In some examples, the access circuitry 730 may be configured as or otherwise support a means for writing fourth data to the second plane based at least in part on performing the computational operation on the second data, where writing the third data from the first plane to the second plane replaces the fourth data with the third data.

In some examples, the associative processing circuitry 725 may be configured as or otherwise support a means for performing, (e.g., using associative computing) concurrent with performing the computational operations on the first data and the second data, the computational operation on fourth data that is stored in a third plane (e.g., plane P2), where the fourth data is representative of a second set of contiguous bits of the vector (e.g., bits 16-23 of vector v0). In some examples, the associative processing circuitry 725 may be configured as or otherwise support a means for performing, (e.g., using associative computing) concurrent with performing the computational operation on the fourth data, the computational operation on fifth data that is stored in a fourth plane (e.g., plane P5), where the fifth data is representative of the second set of contiguous bits of the vector (e.g., bits 16-23 of vector v0).

In some examples, the associative processing circuitry 725 may be configured as or otherwise support a means for performing (e.g., using associative computing) a computational operation on first data that is stored in a first plane (e.g., plane P0) of a plurality of planes including content-addressable memory cells, where the computational operation is based at least in part on a capability of the content-addressable memory cells, and where the first data is representative of a first set of contiguous bits of a vector (e.g., bits 0-7 of vector v0). In some examples, the associative processing circuitry 725 may be configured as or otherwise support a means for performing, (e.g., using associative computing) based at least in part on a first value for an output bit (e.g., $c8_{Act}$) from the computational operation on the first data, the computational operation on second data that is stored in a second plane (e.g., plane P1), where the second data is representative of a second set of contiguous bits of the vector (e.g., bits 8-15 of vector v0). In some examples, the associative processing circuitry 725 may be configured as or otherwise support a means for performing, (e.g., using associative computing) based at least in part on a second value for the output bit (e.g., $c8_{Act}$) from the computational operation on the first data, the computational operation on third data that is stored in a third plane (e.g., plane P4), where the third data is representative of the second set of contiguous bits of the vector (e.g., bits 8-15 of vector v0).

In some examples, the controller 735 may be configured as or otherwise support a means for determining that the output bit (e.g., $c8_{Act}$) from the computational operation on the first data has the first value. In some examples, the access circuitry 730 may be configured as or otherwise support a means for reading from the second plane and writing to the third plane based at least in part on the output bit having the first value, fourth data representative of a result of the computational operation on the third data.

In some examples, the controller 735 may be configured as or otherwise support a means for determining that the output bit (e.g., $c8_{Act}$) from the computational operation on the first data has the second value. In some examples, the access circuitry 730 may be configured as or otherwise support a means for reading from the third plane and writing to the second plane based at least in part on the output bit having the second value, fourth data representative of a result of the computational operation on the third data.

In some examples, the controller 735 may be configured as or otherwise support a means for determining that the output bit (e.g., $c8_{Act}$) from the computational operation on the first data has the first value. In some examples, the access circuitry 730 may be configured as or otherwise support a means for reading from the second plane (e.g., plane P1) and writing to a fourth plane (e.g., plane P2 or plane P5) based at least in part on the determination, fourth data representative of a result of the computational operation on the second data.

In some examples, the associative processing circuitry 725 may be configured as or otherwise support a means for performing, (e.g., using associative computing) based at least in part on the first value, the computational operation on fourth data that is stored in a fourth plane (e.g., plane P2), where the fourth data is representative of a third set of contiguous bits of the vector (e.g., bits 16-23 of vector v0).

In some examples, the associative processing circuitry 725 may be configured as or otherwise support a means for performing, based at least in part on the second value, the computational operation on fifth data that is stored in a fifth plane (e.g., plane P5), where the fifth data is representative of the third set of contiguous bits of the vector (e.g., bits 16-23 of vector v0).

In some examples, the associative processing circuitry 725 may be configured as or otherwise support a means for performing (e.g., using associative computing) a computational operation on first data that is stored in a first plane (e.g., plane P0) of a plurality of planes including content-addressable memory cells, where the computational operation is based at least in part on a capability of the content-addressable memory cells, and where the first data is representative of a first set of contiguous bits of a vector (e.g., bits 0-7 of vector v0). In some examples, the associative processing circuitry 725 may be configured as or otherwise support a means for performing, (e.g., using associative computing) concurrent with the computational operation on the first data, the computational operation on second data that is stored in a second plane (e.g., plane P1) and that represents a second set of contiguous bits (e.g., bits 8-15 of vector v0) that is more significant than the first set of contiguous bits, where the computational operation on the second data is based at least in part on a first value (e.g., 0) for an output bit (e.g., $c8_{Act}$) from the computational operation on the first data. In some examples, the associative processing circuitry 725 may be configured as or otherwise support a means for performing, (e.g., using associative computing) concurrent with the computational operation on the first data, the computational operation on third data that is stored in a third plane (e.g., plane P4) and that represents the second set of contiguous bits of the vector (e.g., bits 8-15 of vector v0), where the computational operation on the third data is based at least in part on a second value (e.g., 1) for the output bit (e.g., $c8_{Act}$) from the computational operation on the first data. In some examples, the access circuitry 730 may be configured as or otherwise support a means for reading from the second plane and writing to the first plane, fourth data representative of a result of the computational operation on the second data, where the fourth data is copied based at least in part on the output bit (e.g., $c8_{Act}$) from the computational operation on the first data having the first value (e.g., 0).

Figure 8:
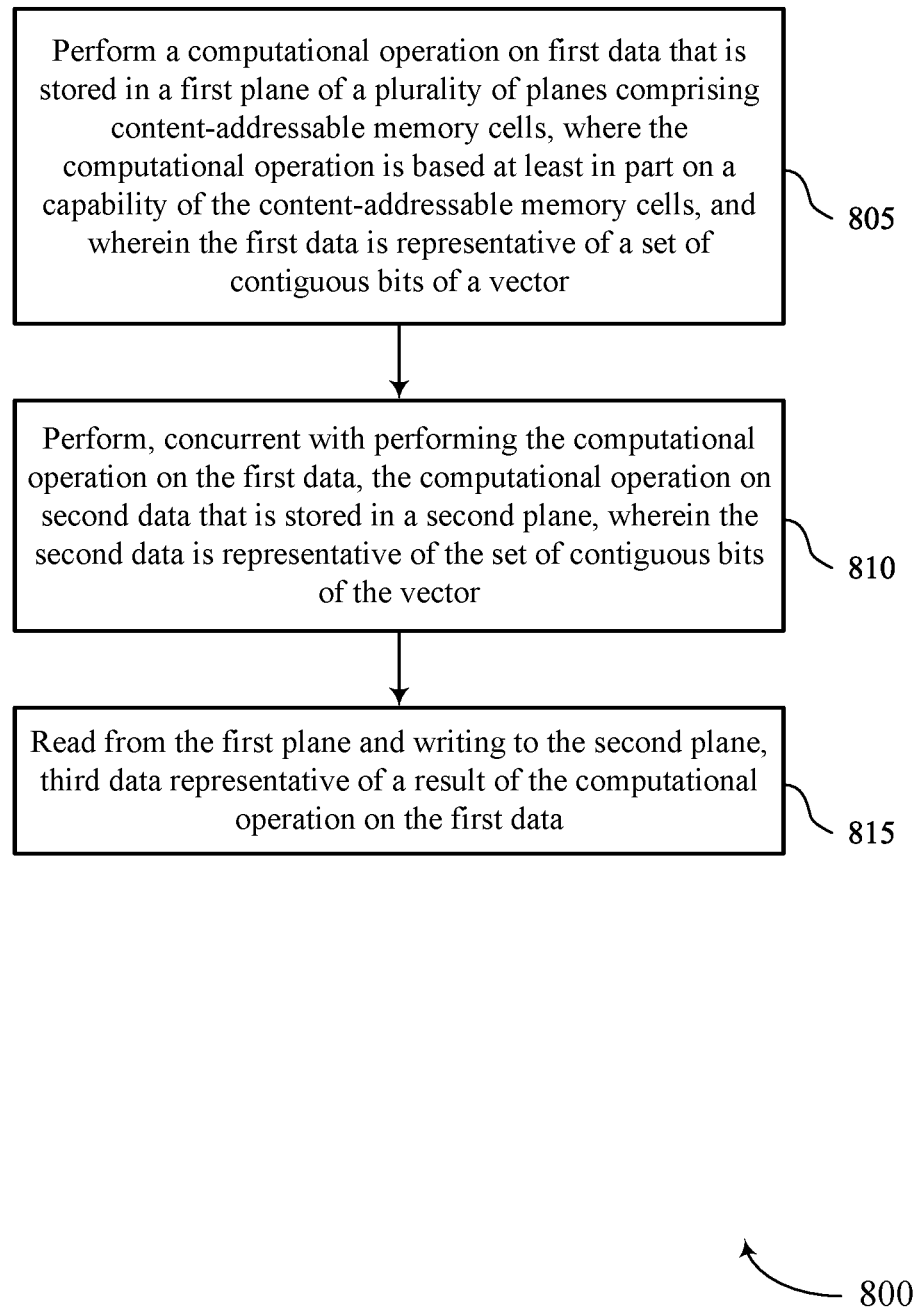
FIGS. 8 through 10 show flowcharts illustrating a method or methods that support redundant computing across planes in accordance with examples as disclosed herein.

FIG. 8 shows a flowchart illustrating a method 800 that supports redundant computing across planes in accordance with examples as disclosed herein. The operations of method 800 may be implemented by a device or its components as described herein. For example, the operations of method 800 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 805, the method may include performing a computational operation on first data that is stored in a first plane of a plurality of planes including content-addressable memory cells, where the computational operation is based at least in part on a capability of the content-addressable memory cells, and where the first data is representative of a set of contiguous bits of a vector. The operations of 805 may be performed in accordance with examples as disclosed herein. In some examples, aspects of the operations of 805 may be performed by an associative processing circuitry 725 as described with reference to FIG. 7.

At 810, the method may include performing, concurrent with performing the computational operation on the first data, the computational operation on second data that is stored in a second plane, where the second data is representative of the set of contiguous bits of the vector. The operations of 810 may be performed in accordance with examples as disclosed herein. In some examples, aspects of the operations of 810 may be performed by an associative processing circuitry 725 as described with reference to FIG. 7.

At 815, the method may include reading from the first plane and writing to the second plane, third data representative of a result of the computational operation on the first data. The operations of 815 may be performed in accordance with examples as disclosed herein. In some examples, aspects of the operations of 815 may be performed by an access circuitry 730 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor), or any combination thereof for performing the following aspects of the present disclosure:

Aspect 1: A method or apparatus, including operations, features, circuitry, logic, means, or instructions, or any combination thereof for performing a computational operation on first data that is stored in a first plane of a plurality of planes including content-addressable memory cells, where the computational operation is based at least in part on a capability of the content-addressable memory cells, and where the first data is representative of a set of contiguous bits of a vector; performing, concurrent with performing the computational operation on the first data, the computational operation on second data that is stored in a second plane, where the second data is representative of the set of contiguous bits of the vector; and reading from the first plane and writing to the second plane, third data representative of a result of the computational operation on the first data.

Aspect 2: The method or apparatus of aspect 1, further including operations, features, circuitry, logic, means, or instructions, or any combination thereof for determining a value of an output bit based at least in part on a second set of contiguous bits of the vector that is less significant than the set of contiguous bits, where the third data is copied from the first plane to the second plane based at least in part on the value for the output bit.

Aspect 3: The method or apparatus of aspect 2 where the computational operation on the first data is based at least in part on a first value for the output bit and the method, apparatuses, and non-transitory computer-readable medium, further includes operations, features, circuitry, logic, means, or instructions, or any combination thereof for determining that the value of the output bit is equal to the first value, where the third data is copied from the first plane to the second plane based at least in part on the value being equal to the first value.

Aspect 4: The method or apparatus of any of aspects 2 through 3, further including operations, features, circuitry, logic, means, or instructions, or any combination thereof for performing the computational operation on fourth data representative of the second set of contiguous bits, where the value for the output bit is based at least in part on performing the computational operation on the fourth data.

Aspect 5: The method or apparatus of aspect 4, further including operations, features, circuitry, logic, means, or instructions, or any combination thereof for the fourth data is stored in a third plane and the computational operation on the fourth data is performed concurrent with the computational operations on the first data and the second data.

Aspect 6: The method or apparatus of any of aspects 1 through 5, further including operations, features, circuitry, logic, means, or instructions, or any combination thereof for writing the third data to the first plane based at least in part on performing the computational operation on the first data and writing fourth data to the second plane based at least in part on performing the computational operation on the second data, where writing the third data from the first plane to the second plane replaces the fourth data with the third data.

Aspect 7: The method or apparatus of any of aspects 1 through 6, further including operations, features, circuitry, logic, means, or instructions, or any combination thereof for performing, concurrent with performing the computational operations on the first data and the second data, the computational operation on fourth data that is stored in a third plane, where the fourth data is representative of a second set of contiguous bits of the vector and performing, concurrent with performing the computational operation on the fourth data, the computational operation on fifth data that is stored in a fourth plane, where the fifth data is representative of the second set of contiguous bits of the vector.

Figure 9:
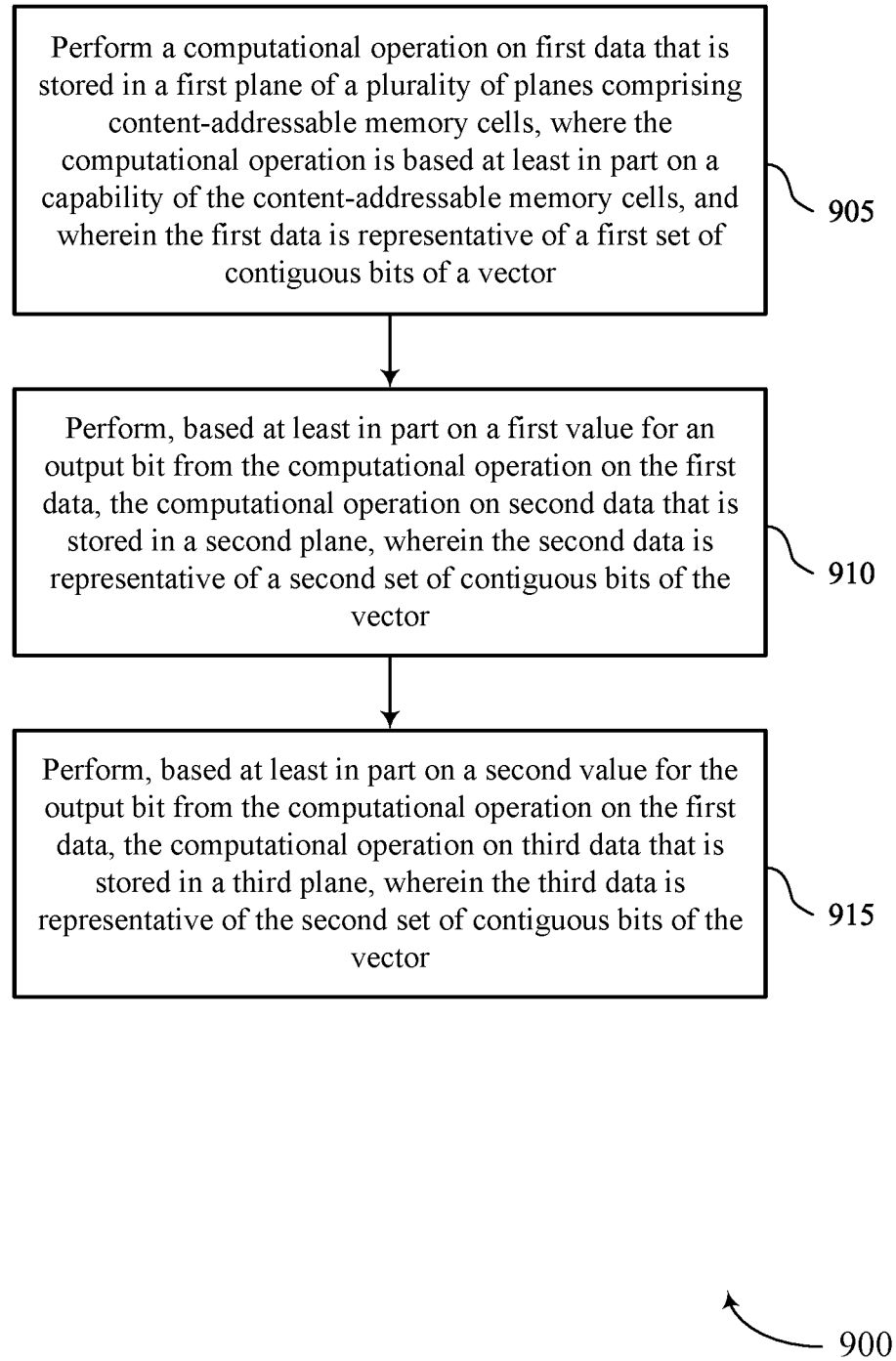

FIG. 9 shows a flowchart illustrating a method 900 that supports redundant computing across planes in accordance with examples as disclosed herein. The operations of method 900 may be implemented by a device or its components as described herein. For example, the operations of method 900 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 905, the method may include performing a computational operation on first data that is stored in a first plane of a plurality of planes including content-addressable memory cells, where the computational operation is based at least in part on a capability of the content-addressable memory cells, and where the first data is representative of a first set of contiguous bits of a vector. The operations of 905 may be performed in accordance with examples as disclosed herein. In some examples, aspects of the operations of 905 may be performed by an associative processing circuitry 725 as described with reference to FIG. 7.

At 910, the method may include performing, based at least in part on a first value for an output bit from the computational operation on the first data, the computational operation on second data that is stored in a second plane, where the second data is representative of a second set of contiguous bits of the vector. The operations of 910 may be performed in accordance with examples as disclosed herein. In some examples, aspects of the operations of 910 may be performed by an associative processing circuitry 725 as described with reference to FIG. 7.

At 915, the method may include performing, based at least in part on a second value for the output bit from the computational operation on the first data, the computational operation on third data that is stored in a third plane, where the third data is representative of the second set of contiguous bits of the vector. The operations of 915 may be performed in accordance with examples as disclosed herein. In some examples, aspects of the operations of 915 may be performed by an associative processing circuitry 725 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor), or any combination thereof for performing the following aspects of the present disclosure:

Aspect 8: A method or apparatus, including operations, features, circuitry, logic, means, or instructions, or any combination thereof for performing a computational operation on first data that is stored in a first plane of a plurality of planes including content-addressable memory cells, where the computational operation is based at least in part on a capability of the content-addressable memory cells, and where the first data is representative of a first set of contiguous bits of a vector; performing, based at least in part on a first value for an output bit from the computational operation on the first data, the computational operation on second data that is stored in a second plane, where the second data is representative of a second set of contiguous bits of the vector; and performing, based at least in part on a second value for the output bit from the computational operation on the first data, the computational operation on third data that is stored in a third plane, where the third data is representative of the second set of contiguous bits of the vector.

Aspect 9: The method or apparatus of aspect 8, further including operations, features, circuitry, logic, means, or instructions, or any combination thereof for determining that the output bit from the computational operation on the first data has the first value and reading from the second plane and writing to the third plane based at least in part on the output bit having the first value, fourth data representative of a result of the computational operation on the third data.

Aspect 10: The method or apparatus of any of aspects 8 through 9, further including operations, features, circuitry, logic, means, or instructions, or any combination thereof for determining that the output bit from the computational operation on the first data has the second value and reading from the third plane and writing to the second plane based at least in part on the output bit having the second value, fourth data representative of a result of the computational operation on the third data.

Aspect 11: The method or apparatus of any of aspects 8 through 10, further including operations, features, circuitry, logic, means, or instructions, or any combination thereof for determining that the output bit from the computational operation on the first data has the first value and reading from the second plane and writing to a fourth plane based at least in part on the determination, fourth data representative of a result of the computational operation on the second data.

Aspect 12: The method or apparatus of any of aspects 8 through 11, further including operations, features, circuitry, logic, means, or instructions, or any combination thereof for performing, based at least in part on the first value, the computational operation on fourth data that is stored in a fourth plane, where the fourth data is representative of a third set of contiguous bits of the vector and performing, based at least in part on the second value, the computational operation on fifth data that is stored in a fifth plane, where the fifth data is representative of the third set of contiguous bits of the vector.

Figure 10:
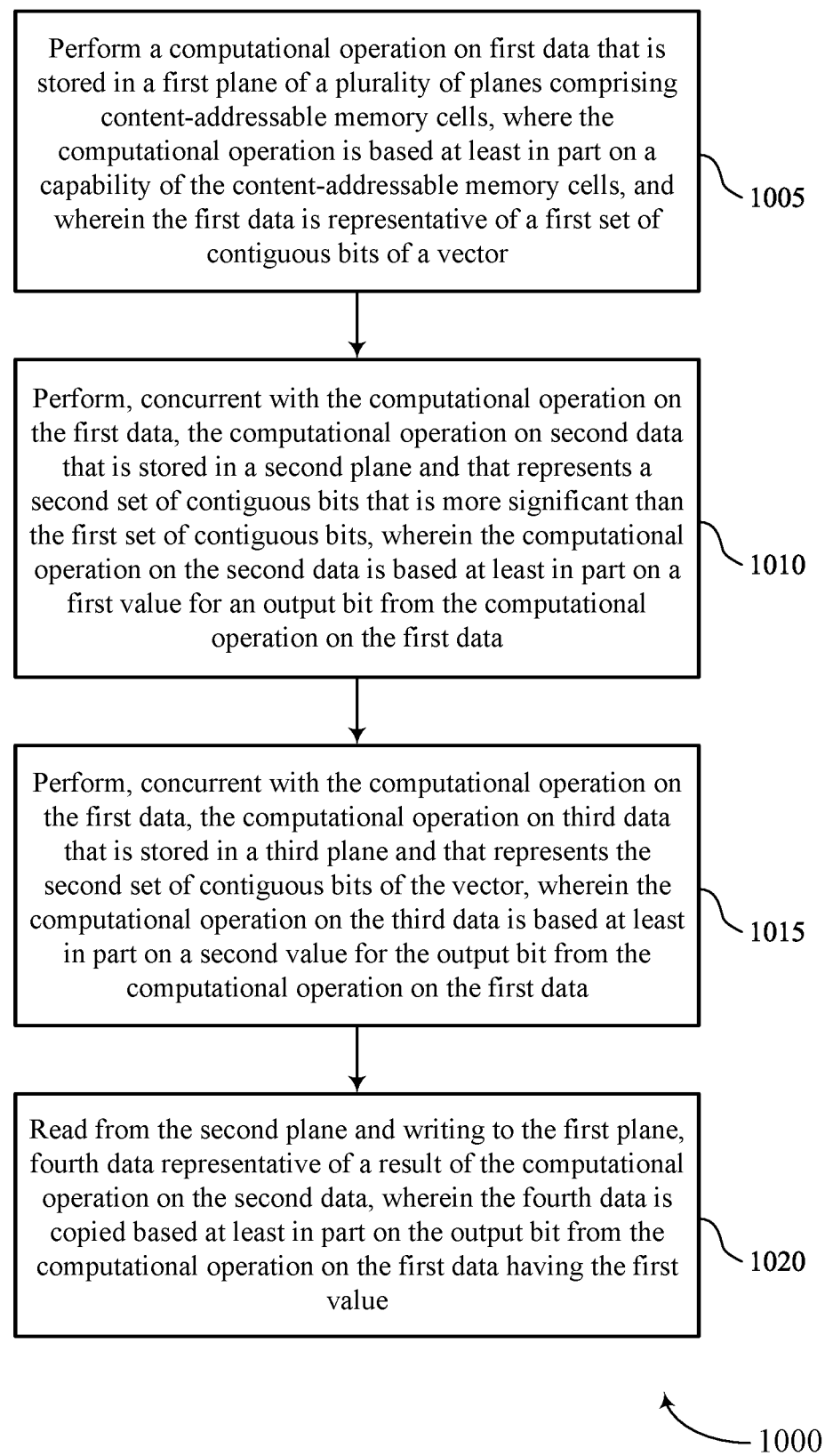

FIG. 10 shows a flowchart illustrating a method 1000 that supports redundant computing across planes in accordance with examples as disclosed herein. The operations of method 1000 may be implemented by a device or its components as described herein. For example, the operations of method 1000 may be performed by a device as described with reference to FIGS. 1 through 7. In some examples, a device may execute a set of instructions to control the functional elements of the device to perform the described functions. Additionally or alternatively, the device may perform aspects of the described functions using special-purpose hardware.

At 1005, the method may include performing a computational operation on first data that is stored in a first plane of a plurality of planes including content-addressable memory cells, where the computational operation is based at least in part on a capability of the content-addressable memory cells, and where the first data is representative of a first set of contiguous bits of a vector. The operations of 1005 may be performed in accordance with examples as disclosed herein. In some examples, aspects of the operations of 1005 may be performed by an associative processing circuitry 725 as described with reference to FIG. 7.

At 1010, the method may include performing, concurrent with the computational operation on the first data, the computational operation on second data that is stored in a second plane and that represents a second set of contiguous bits that is more significant than the first set of contiguous bits, where the computational operation on the second data is based at least in part on a first value for an output bit from the computational operation on the first data. The operations of 1010 may be performed in accordance with examples as disclosed herein. In some examples, aspects of the operations of 1010 may be performed by an associative processing circuitry 725 as described with reference to FIG. 7.

At 1015, the method may include performing, concurrent with the computational operation on the first data, the computational operation on third data that is stored in a third plane and that represents the second set of contiguous bits of the vector, where the computational operation on the third data is based at least in part on a second value for the output bit from the computational operation on the first data. The operations of 1015 may be performed in accordance with examples as disclosed herein. In some examples, aspects of the operations of 1015 may be performed by an associative processing circuitry 725 as described with reference to FIG. 7.

At 1020, the method may include reading from the second plane and writing to the first plane, fourth data representative of a result of the computational operation on the second data, where the fourth data is copied based at least in part on the output bit from the computational operation on the first data having the first value. The operations of 1020 may be performed in accordance with examples as disclosed herein. In some examples, aspects of the operations of 1020 may be performed by an access circuitry 730 as described with reference to FIG. 7.

In some examples, an apparatus as described herein may perform a method or methods, such as the method 1000. The apparatus may include, features, circuitry, logic, means, or instructions (e.g., a non-transitory computer-readable medium storing instructions executable by a processor), or any combination thereof for performing the following aspects of the present disclosure:

Aspect 13: A method or apparatus, including operations, features, circuitry, logic, means, or instructions, or any combination thereof for performing a computational operation on first data that is stored in a first plane of a plurality of planes including content-addressable memory cells, where the computational operation is based at least in part on a capability of the content-addressable memory cells, and where the first data is representative of a first set of contiguous bits of a vector; performing, concurrent with the computational operation on the first data, the computational operation on second data that is stored in a second plane and that represents a second set of contiguous bits that is more significant than the first set of contiguous bits, where the computational operation on the second data is based at least in part on a first value for an output bit from the computational operation on the first data; performing, concurrent with the computational operation on the first data, the computational operation on third data that is stored in a third plane and that represents the second set of contiguous bits of the vector, where the computational operation on the third data is based at least in part on a second value for the output bit from the computational operation on the first data; and reading from the second plane and writing to the first plane, fourth data representative of a result of the computational operation on the second data, where the fourth data is copied based at least in part on the output bit from the computational operation on the first data having the first value.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: a memory die including a plurality of planes arranged in a plurality of tiles, of the plurality of planes including content-addressable memory cells; and logic coupled with the memory die and configured to: perform a computational operation on first data that is stored in a first plane of the plurality of planes, where the computational operation is based at least in part on a capability of the content-addressable memory cells, and where the first data is representative of a set of contiguous bits of a vector; perform, concurrent with performing the computational operation on the first data, the computational operation on second data that is stored in a second plane of the plurality of planes, where the second data is representative of the set of contiguous bits of the vector; and read, from the first plane and write to the second plane, third data representative of a result of the computational operation on the first data.

Aspect 15: The apparatus of aspect 14, where the logic is further configured to: determine a value of an output bit based at least in part on a second set of contiguous bits of the vector that is less significant than the set of contiguous bits, where the third data is copied from the first plane to the second plane based at least in part on the value for the output bit.

Aspect 16: The apparatus of aspect 15, where the computational operation on the first data is based at least in part on a first value for the output bit, and where the computational operation on the second data is based at least in part on a second value for the output bit, and where the logic is further configured to: determine that the value of the output bit is equal to the first value, where the third data is copied from the first plane to the second plane based at least in part on the value being equal to the first value.

Aspect 17: The apparatus of any of aspects 15 through 16, where the logic is further configured to: perform the computational operation on fourth data representative of the second set of contiguous bits, where the value for the output bit is based at least in part on performing the computational operation on the fourth data.

Aspect 18: The apparatus of aspect 17, where the fourth data is stored in a third plane of the plurality of planes, and the computational operation on the fourth data is performed concurrent with the computational operations on the first data and the second data.

Aspect 19: The apparatus of any of aspects 14 through 18, where the logic is further configured to: write the third data to the first plane based at least in part on performing the computational operation on the first data; and write fourth data to the second plane based at least in part on performing the computational operation on the second data, where writing the third data from the first plane to the second plane replaces the fourth data with the third data.

Aspect 20: The apparatus of any of aspects 14 through 19, where the logic is further configured to: perform, concurrent with performing the computational operations on the first data and the second data, the computational operation on fourth data that is stored in a third plane, where the fourth data is representative of a second set of contiguous bits of the vector; and perform, concurrent with performing the computational operation on the fourth data, the computational operation on fifth data that is stored in a fourth plane of the plurality of planes, where the fifth data is representative of the second set of contiguous bits of the vector.

Aspect 21: The apparatus of aspect 20, where the logic is further configured to: read from the third plane and write to the fourth plane, sixth data representative of a result of the computational operation on the fourth data.

Aspect 22: The apparatus of any of aspects 14 through 21, where the first plane and the second plane are in different tiles of the plurality of tiles.

Aspect 23: The apparatus of any of aspects 14 through 22, where the first plane and the second plane are in a same tile of the plurality of tiles.

An apparatus is described. The following provides an overview of aspects of the apparatus as described herein:

Aspect 24: An apparatus, including: a memory die including a plurality of planes arranged in a plurality of tiles, of the plurality of planes including content-addressable memory cells; logic coupled with the memory die and configured to: perform a computational operation on first data that is stored in a first plane, where the computational operation is based at least in part on a capability of the content-addressable memory cells, and where the first data is representative of a first set of contiguous bits of a vector; perform, based at least in part on a first value for an output bit from the computational operation on the first data, the computational operation on second data that is stored in a second plane, where the second data is representative of a second set of contiguous bits of the vector; and perform, based at least in part on a second value for the output bit from the computational operation on the first data, the computational operation on third data that is stored in a third plane, where the third data is representative of the second set of contiguous bits of the vector.

Aspect 25: The apparatus of aspect 24, where the computational operations on the first data, the second data, and the third data are performed concurrently.

Aspect 26: The apparatus of any of aspects 24 through 25, where the second set of contiguous bits is more significant than the first set of contiguous bits.

Aspect 27: The apparatus of any of aspects 24 through 26, where the logic is further configured to: determine that the output bit from the computational operation on the first data has the first value; and read from the second plane and write to the third plane based at least in part on the output bit having the first value, fourth data representative of a result of the computational operation on the third data.

Aspect 28: The apparatus of any of aspects 24 through 27, where the logic is further configured to: determine that the output bit from the computational operation on the first data has the second value; and read from the third plane and write to the second plane based at least in part on the output bit having the second value, fourth data representative of a result of the computational operation on the third data.

Aspect 29: The apparatus of any of aspects 24 through 28, where the logic is further configured to: determine that the output bit from the computational operation on the first data has the first value; and read from the second plane and write to a fourth plane based at least in part on the determination, fourth data representative of a result of the computational operation on the second data.

Aspect 30: The apparatus of any of aspects 24 through 29, where the logic is further configured to: perform, based at least in part on the first value, the computational operation on fourth data that is stored in a fourth plane, where the fourth data is representative of a third set of contiguous bits of the vector; and perform, based at least in part on the second value, the computational operation on fifth data that is stored in a fifth plane, where the fifth data is representative of the third set of contiguous bits of the vector.

Aspect 31: The apparatus of aspect 30, where the computational operations on the fourth data and the fifth data are concurrent with the computational operations on the first data, the second data, and the third data.

Aspect 32: The apparatus of any of aspects 30 through 31, where the logic is further configured to: determine that a second output bit from the computational operation on the second data has the first value; and read from the fourth plane and write to the fifth plane and based at least in part on the second output bit having the first value, sixth data representative of a result of the computational operation on the second data.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

Two or more actions may occur "in parallel" if the actions occur at the same time, at substantially the same time, at partially overlapping times, or at wholly overlapping times.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory die comprising a plurality of planes arranged in a plurality of tiles, of the plurality of planes comprising content-addressable memory cells; and
   logic coupled with the memory die and configured to:
   perform a computational operation on first data that is stored in a first plane of the plurality of planes, wherein the computational operation is based at least in part on a capability of the content-addressable memory cells, and wherein the first data is representative of a set of contiguous bits of a vector;

perform, concurrent with performing the computational operation on the first data, the computational operation on second data that is stored in a second plane of the plurality of planes, wherein the second data is representative of the set of contiguous bits of the vector; and read, from the first plane and write to the second plane, third data representative of a result of the computational operation on the first data.

2. The apparatus of claim 1, wherein the logic is further configured to:

determine a value of an output bit based at least in part on a second set of contiguous bits of the vector that is less significant than the set of contiguous bits, wherein the third data is copied from the first plane to the second plane based at least in part on the value for the output bit.

3. The apparatus of claim 2, wherein the computational operation on the first data is based at least in part on a first value for the output bit, and wherein the computational operation on the second data is based at least in part on a second value for the output bit, and wherein the logic is further configured to:

determine that the value of the output bit is equal to the first value, wherein the third data is copied from the first plane to the second plane based at least in part on the value being equal to the first value.

4. The apparatus of claim 2, wherein the logic is further configured to:

perform the computational operation on fourth data representative of the second set of contiguous bits, wherein the value for the output bit is based at least in part on performing the computational operation on the fourth data.

5. The apparatus of claim 4, wherein the fourth data is stored in a third plane of the plurality of planes, and wherein the computational operation on the fourth data is performed concurrent with the computational operations on the first data and the second data.

6. The apparatus of claim 1, wherein the logic is further configured to:

write the third data to the first plane based at least in part on performing the computational operation on the first data; and write fourth data to the second plane based at least in part on performing the computational operation on the second data, wherein writing the third data from the first plane to the second plane replaces the fourth data with the third data.

7. The apparatus of claim 1, wherein the logic is further configured to:

perform, concurrent with performing the computational operations on the first data and the second data, the computational operation on fourth data that is stored in a third plane, wherein the fourth data is representative of a second set of contiguous bits of the vector; and perform, concurrent with performing the computational operation on the fourth data, the computational operation on fifth data that is stored in a fourth plane of the plurality of planes, wherein the fifth data is representative of the second set of contiguous bits of the vector.

8. The apparatus of claim 7, wherein the logic is further configured to:

read from the third plane and write to the fourth plane, sixth data representative of a result of the computational operation on the fourth data.

9. The apparatus of claim 1, wherein the first plane and the second plane are in different tiles of the plurality of tiles.

10. The apparatus of claim 1, wherein the first plane and the second plane are in a same tile of the plurality of tiles.

11. An apparatus, comprising:

a memory die comprising a plurality of planes arranged in a plurality of tiles, of the plurality of planes comprising content-addressable memory cells; and logic coupled with the memory die and configured to:

perform a computational operation on first data that is stored in a first plane, wherein the computational operation is based at least in part on a capability of the content-addressable memory cells, and wherein the first data is representative of a first set of contiguous bits of a vector;

perform, based at least in part on a first value for an output bit from the computational operation on the first data, the computational operation on second data that is stored in a second plane, wherein the second data is representative of a second set of contiguous bits of the vector; and perform, based at least in part on a second value for the output bit from the computational operation on the first data, the computational operation on third data that is stored in a third plane, wherein the third data is representative of the second set of contiguous bits of the vector.

12. The apparatus of claim 11, wherein the computational operations on the first data, the second data, and the third data are performed concurrently.

13. The apparatus of claim 11, wherein the second set of contiguous bits is more significant than the first set of contiguous bits.

14. The apparatus of claim 11, wherein the logic is further configured to:

determine that the output bit from the computational operation on the first data has the first value; and read from the second plane and write to the third plane based at least in part on the output bit having the first value, fourth data representative of a result of the computational operation on the third data.

15. The apparatus of claim 11, wherein the logic is further configured to:

determine that the output bit from the computational operation on the first data has the second value; and read from the third plane and write to the second plane based at least in part on the output bit having the second value, fourth data representative of a result of the computational operation on the third data.

16. The apparatus of claim 11, wherein the logic is further configured to:

determine that the output bit from the computational operation on the first data has the first value; and read from the second plane and write to a fourth plane based at least in part on the determination, fourth data representative of a result of the computational operation on the second data.

17. The apparatus of claim 11, wherein the logic is further configured to:

perform, based at least in part on the first value, the computational operation on fourth data that is stored in a fourth plane, wherein the fourth data is representative of a third set of contiguous bits of the vector; and perform, based at least in part on the second value, the computational operation on fifth data that is stored in a fifth plane, wherein the fifth data is representative of the third set of contiguous bits of the vector.

18. The apparatus of claim 17, wherein the computational operations on the fourth data and the fifth data are concurrent with the computational operations on the first data, the second data, and the third data.

19. The apparatus of claim 17, wherein the logic is further configured to:

determine that a second output bit from the computational operation on the second data has the first value; and read from the fourth plane and write to the fifth plane and based at least in part on the second output bit having the first value, sixth data representative of a result of the computational operation on the second data.

20. A method, comprising:

performing a computational operation on first data that is stored in a first plane of a plurality of planes comprising content-addressable memory cells, wherein the computational operation is based at least in part on a capability of the content-addressable memory cells, and wherein the first data is representative of a set of contiguous bits of a vector;

performing, concurrent with performing the computational operation on the first data, the computational operation on second data that is stored in a second plane, wherein the second data is representative of the set of contiguous bits of the vector; and reading from the first plane and writing to the second plane, third data representative of a result of the computational operation on the first data.

21. The method of claim 20, further comprising:

determining a value of an output bit based at least in part on a second set of contiguous bits of the vector that is less significant than the set of contiguous bits, wherein the third data is copied from the first plane to the second plane based at least in part on the value for the output bit.

22. The method of claim 21, wherein the computational operation on the first data is based at least in part on a first value for the output bit, and wherein the computational operation on the second data is based at least in part on a second value for the output bit, the method further comprising:

determining that the value of the output bit is equal to the first value, wherein the third data is copied from the first plane to the second plane based at least in part on the value being equal to the first value.

23. The method of claim 21, further comprising:

performing the computational operation on fourth data representative of the second set of contiguous bits, wherein the value for the output bit is based at least in part on performing the computational operation on the fourth data.

24. The method of claim 23, wherein the fourth data is stored in a third plane, and wherein the computational operation on the fourth data is performed concurrent with the computational operations on the first data and the second data.

25. The method of claim 20, further comprising:

writing the third data to the first plane based at least in part on performing the computational operation on the first data; and writing fourth data to the second plane based at least in part on performing the computational operation on the second data, wherein writing the third data from the first plane to the second plane replaces the fourth data with the third data.

26. The method of claim 20, further comprising:

performing, concurrent with performing the computational operations on the first data and the second data, the computational operation on fourth data that is stored in a third plane, wherein the fourth data is representative of a second set of contiguous bits of the vector; and performing, concurrent with performing the computational operation on the fourth data, the computational operation on fifth data that is stored in a fourth plane, wherein the fifth data is representative of the second set of contiguous bits of the vector.

27. A method, comprising:

performing a computational operation on first data that is stored in a first plane of a plurality of planes comprising content-addressable memory cells, wherein the computational operation is based at least in part on a capability of the content-addressable memory cells, and wherein the first data is representative of a first set of contiguous bits of a vector;

performing, based at least in part on a first value for an output bit from the computational operation on the first data, the computational operation on second data that is stored in a second plane, wherein the second data is representative of a second set of contiguous bits of the vector; and performing, based at least in part on a second value for the output bit from the computational operation on the first data, the computational operation on third data that is stored in a third plane, wherein the third data is representative of the second set of contiguous bits of the vector.

28. The method of claim 27, further comprising:

determining that the output bit from the computational operation on the first data has the first value; and reading from the second plane and writing to the third plane based at least in part on the output bit having the first value, fourth data representative of a result of the computational operation on the third data.

29. The method of claim 27, further comprising:

determining that the output bit from the computational operation on the first data has the second value; and reading from the third plane and writing to the second plane based at least in part on the output bit having the second value, fourth data representative of a result of the computational operation on the third data.

30. The method of claim 27, further comprising:

determining that the output bit from the computational operation on the first data has the first value; and reading from the second plane and writing to a fourth plane based at least in part on the determination, fourth data representative of a result of the computational operation on the second data.

31. The method of claim 27, further comprising:

performing, based at least in part on the first value, the computational operation on fourth data that is stored in a fourth plane, wherein the fourth data is representative of a third set of contiguous bits of the vector; and performing, based at least in part on the second value, the computational operation on fifth data that is stored in a fifth plane, wherein the fifth data is representative of the third set of contiguous bits of the vector.

32. A method, comprising:
- performing a computational operation on first data that is stored in a first plane of a plurality of planes comprising content-addressable memory cells, wherein the computational operation is based at least in part on a capability of the content-addressable memory cells, and wherein the first data is representative of a first set of contiguous bits of a vector;
- performing, concurrent with the computational operation on the first data, the computational operation on second data that is stored in a second plane and that represents a second set of contiguous bits that is more significant than the first set of contiguous bits, wherein the computational operation on the second data is based at least in part on a first value for an output bit from the computational operation on the first data;
- performing, concurrent with the computational operation on the first data, the computational operation on third data that is stored in a third plane and that represents the second set of contiguous bits of the vector, wherein the computational operation on the third data is based at least in part on a second value for the output bit from the computational operation on the first data; and
- reading from the second plane and writing to the first plane, fourth data representative of a result of the computational operation on the second data, wherein the fourth data is copied based at least in part on the output bit from the computational operation on the first data having the first value.

* * * * *